United States Patent [19]
Matsuzawa et al.

[11] Patent Number: 6,084,723
[45] Date of Patent: Jul. 4, 2000

[54] EXPOSURE APPARATUS

[75] Inventors: Hitoshi Matsuzawa, Setagaya-ku; Koji Shigematsu; Kazumasa Endo, both of Kawasaki; Yutaka Suenaga, Yokohama, all of Japan

[73] Assignee: Nikon Corporation, Japan

[21] Appl. No.: 08/705,079

[22] Filed: Aug. 29, 1996

Related U.S. Application Data

[63] Continuation of application No. 08/500,213, Jul. 10, 1995, abandoned.

[30] Foreign Application Priority Data

Mar. 15, 1995 [JP] Japan .................................. 7-055979

[51] Int. Cl.[7] .................................................. G02B 13/24
[52] U.S. Cl. ......................................... 359/754; 359/766
[58] Field of Search ............................... 359/754, 755, 359/756, 766

[56] References Cited

U.S. PATENT DOCUMENTS

| | | |
|---|---|---|
| 3,737,215 | 6/1973 | De Jager . |
| 3,817,138 | 6/1974 | Xano .................................. 359/754 |
| 3,909,115 | 9/1975 | Kano et al. . |
| 3,955,883 | 5/1976 | Sugiyama . |
| 4,080,048 | 3/1978 | Kimura . |
| 4,451,125 | 5/1984 | Sato .................................. 359/766 |
| 4,653,871 | 3/1987 | Hamanishi ........................ 359/754 |
| 4,666,273 | 5/1987 | Shimizu et al. . |
| 4,690,528 | 9/1987 | Tanimoto et al. . |
| 4,770,477 | 9/1988 | Shafer . |
| 4,772,107 | 9/1988 | Friedman . |
| 4,790,638 | 12/1988 | Iwasaki et al. .................... 359/766 |
| 4,811,055 | 3/1989 | Hirose . |
| 4,825,247 | 4/1989 | Kemi et al. . |
| 4,891,663 | 1/1990 | Hirose . |
| 4,977,426 | 12/1990 | Hirose . |
| 5,097,291 | 3/1992 | Suzuki . |
| 5,105,075 | 4/1992 | Ohta et al. . |
| 5,159,496 | 10/1992 | Kataoka . |
| 5,194,893 | 3/1993 | Nishi . |
| 5,245,384 | 9/1993 | Mori . |
| 5,260,832 | 11/1993 | Togino et al. . |
| 5,831,776 | 11/1998 | Sasaya et al. .................... 359/754 |

FOREIGN PATENT DOCUMENTS

| | | |
|---|---|---|
| 0 299 474 | 1/1989 | European Pat. Off. . |
| 0041528 | 3/1977 | Japan ............................ 359/766 |
| 63-118115 | 5/1988 | Japan . |
| 4-157412 | 5/1992 | Japan . |
| WO 93/04391 | 3/1993 | WIPO . |

OTHER PUBLICATIONS

U.S. Patent Application Serial No.08/255,927 filed on Jun. 7, 1994 by Nakashima et al.
U.S. Patent Application Serial No. 08/226,327 filed on Apr. 12, 1994 by Hirukawa.
U.S. Patent Application Serial No. 08/299,305 filed on Sep. 1, 1994 by Ota et al.
Patent Abstracts of Japan, vol. 17, No. 586 (P–1633) Oct. 26, 1993 & JP–A–05 173 065 (Olympus) Jul. 13, 1993.
Patent Abstracts of Japan, vol. 12, No. 366 (P–765) Sep. 30, 1988 & JP–A–63 118 115 (Sigma) May 23, 1988.
Patent Abstracts of Japan, vol. 7, No. 73 (p–186) Mar. 25, 1983 & JP–A–58 004 112 (Olympus).

*Primary Examiner*—Edward P. Westin
*Assistant Examiner*—Richard Hanig
*Attorney, Agent, or Firm*—Pennie & Edmonds LLP

[57] ABSTRACT

The present invention relates to an exposure apparatus having a high-performance projection optical system having a relatively large numerical aperture and achieving bitelecentricity and superior correction of aberrations, particularly distortion, in a very wide exposure area. Particularly, the protection optical system according to the present invention is composed of a first lens group $G_1$ with a positive refracting power, a second lens group $G_2$ with a negative refracting power, a third lens group $G_3$ with a positive refracting power, a fourth lens group $G_4$ with a negative refracting power, and a fifth lens group $G_5$ with a positive refracting power in order from the side of a first object R. The present invention is directed to finding of suitable ranges of focal lengths for the first to fifth lens groups $G_1$–$G_5$, based on the above arrangement.

35 Claims, 10 Drawing Sheets

EXPOSURE APPARATUS

This is a continuation of application Ser. No. 08/500,213, filed Jul. 10, 1995, now abandoned.

BACKGROUND OF THE INVENTION

1. Field of the Invention

The present invention relates to an exposure apparatus having a projection optical system for projecting a pattern of a first object onto a photosensitive substrate etc. as a second object, and more particularly to a projection optical system suitably applicable to projection exposure of a pattern for semiconductor or liquid crystal formed on a reticle (mask) as the first object onto the substrate (semiconductor wafer, plate, etc.) as the second object.

2. Related Background Art

As the pasterns of integrated circuits become finer and finer, the resolving power required for the exposure apparatus used in printing of wafer also becomes higher and higher. In addition to the improvement in resolving power, the projection optical systems of the exposure apparatus are required to decrease image stress.

Here, the image stress includes those due to bowing etc. of the printed wafer on the image side of projection optical system and those due to bowing etc. of the reticle with circuit pattern etc. written therein, on the object side of projection optical system, as well as distortion caused by the projection optical system.

With a recent further progress of fineness tendency of transfer patterns, demands to decrease the image stress are also becoming harder.

Then, in order to decrease effects of the wafer bowing on the image stress, the conventional technology has employed the so-called image-side telecentric optical system that located the exit pupil position at a farther point on the image side of projection optical system.

On the other hand, the image stress due to the bowing of reticle can also be reduced by employing a so-called object-side telecentric optical system that locates the entrance pupil position of projection optical system at a farther point from the object plane, and there are suggestions to locate the entrance pupil position of projection optical system at a relatively far position from the object plane as described. Examples of those suggestions are described for example in Japanese Laid-open Patent Applications No. 63-118115 and No. 5-173065 and U.S. Pat. No. 5,260,832.

SUMMARY OF THE INVENTION

An object of the present invention is to provide a high-performance projection optical system having a relatively large numerical aperture and achieving the bitelecentricity and good correction of aberrations, particularly distortion, in a very wide exposure area (exposure field). In general, the projection optical system can be applied to an exposure apparatus.

To obtain the remarkably wider exposure area than conventional projection optical systems, the present invention involves an exposure apparatus having a high-performance projection optical system comprising at least a first stage (wafer stage) allowing a photosensitive substrate (for example, a semiconductor wafer coated with a photosensitive material such as a photoresist) to be held on a main surface thereof, an illumination optical system having a light source for emitting exposure light of a predetermined wavelength and transferring a predetermined pattern on a mask onto the substrate, and a projecting optical system for projecting an image on the mask, on the substrate surface. And the exposure apparatus further comprises a second stage (reticle stage) for supporting the mask at a predetermined position. The above projecting optical system is provided between the first stage and the second stage and projects an image of a first object (for example, a mask with a pattern such as an integrated circuit) onto a second object (for example, a photosensitive substrate).

As shown in FIG. 1, the projection optical system comprises a first lens group $G_1$ with positive refracting power, a second lens group $G_2$ with negative refracting power, a third lens group $G_3$ with positive refracting power, a fourth lens group $G_4$ with negative refracting power, and a fifth lens group $G_5$ with positive refracting power in the named order from the side of the first object R. A magnification of the projection optical system is 1/2.5 so as to obtain a wider exposure field.

The first lens group $G_1$ with the positive refracting power contributes to correction of distortion while maintaining the telecentricity. Specifically, the first lens group $G_1$ generates positive distortion to correct in a good balance for negative distortion generated by a plurality of lens groups located on the second object side of the first lens group $G_1$. The second lens group $G_2$ with the negative refracting power and the fourth lens group $G_4$ with the negative refracting power contribute mainly to correction of Petzval sum to flatten the image surface. The second lens group $G_2$ with the negative refracting power and the third lens group $G_3$ with the positive refracting power compose an inverted telephoto system in combination and contribute to securing the back focus (a distance from an optical surface such as a lens surface closest to the second object W in the projection optical system to the second object W) of the projection optical system. The fifth lens group $G_5$ with the positive refracting power contributes mainly to suppressing appearance of distortion, and suppressing appearance of spherical aberration in particular as much as possible in order to fully meet a demand to achieve a high numerical aperture on the second object side.

Further, when $f_1$ is a focal length of the first lens group $G_1$, $f_2$ is a focal length of the second lens group $G_2$, $f_3$ is a focal length of the third lens group $G_3$, $f_4$ is a focal length of the fourth lens group $G_4$, $f_5$ is a focal length of the fifth lens group $G_5$, $f_{1\text{-}3}$ is a composite focal length of the first lens group $G_1$ to third lens group $G_3$, $f_{4\text{-}5}$ is a composite focal length of the fourth lens group $G_4$ and the fifth lens group $G_5$, and L is a distance from the first object R to the second object W, the following conditions are satisfied:

$$0.1 < f_1/f_3 < 17 \tag{1}$$

$$0.1 < f_2/f_4 < 14 \tag{2}$$

$$0.1 < f_5/L < 0.8 \tag{3}$$

$$f_{1\text{-}3}/f_{4\text{-}5} < 2.5. \tag{4}$$

The condition (1) defines an optimum ratio between the focal length $f_1$ of the first lens group $G_1$ with positive refracting power and the focal length $f_3$ of the third lens group $G_3$ with positive refracting power, which is an optimum refracting power (power) balance between the first lens group $G_1$ and the third lens group $G_3$. This condition (1) is mainly for correcting the distortion in a good balance. Below the lower limit of this condition (1) a large negative distortion is produced because the refracting power of the third lens group $G_3$ becomes relatively weak to the refracting power of the first lens group $G_1$. Above the upper limit of the condition (1) a large negative distortion is produced because the refracting power of the first lens group $G_1$ becomes relatively weak to the refracting power of the third lens group $G_3$.

The condition (2) defines an optimum ratio between the focal length $f_2$ of the second lens group $G_2$ with negative refracting power and the focal length $f_4$ of the fourth lens group $G_4$ with negative refracting power, which is an optimum refracting power (power) balance between the second lens group $G_2$ and the fourth lens group $G_4$. This condition (2) is mainly for keeping the Petzval sum small so as to correct the curvature of field well while securing a wide exposure field. Below the lower limit of the condition (2), a large positive Petzval sum appears because the refracting power of the fourth lens group $G_4$ becomes relatively weak to the refracting power of the second lens group $G_2$. Above the upper limit of the condition (2) a large positive Petzval sum appears because the refracting power of the second lens group $G_2$ becomes relatively weak to the refracting power of the fourth lens group $G_4$. In order to correct the Petzval sum in a better balance under a wide exposure field by making the refracting power of the fourth lens group $G_4$ strong relative to the refracting power of the second lens group $G_2$, the lower limit of the above condition (2) is preferably set to 0.8, i.e., $0.8 < f_2/f_4$.

The condition (3) defines an optimum ratio between the focal length $f_5$ of the fifth lens group $G_5$ with positive refracting power and the distance (object-image distance) L from the first object R (reticle etc.) and the second object W (wafer etc.). This condition (3) is for correcting the spherical aberration, distortion, and Petzval sum in a good balance while keeping a large numerical aperture. Below the lower limit of this condition (3) the refracting power of the fifth lens group $G_5$ is too strong, so that this fifth lens group $G_5$ generates not only a negative distortion but also a great negative spherical aberration. Above the upper limit of this condition (3) the refracting power of the fifth lens group $G_5$ is too weak, so that the refracting power of the fourth lens group $G_4$ with negative refracting power inevitably also becomes weak therewith, thereby resulting in failing to correct the Petzval sum well.

The condition (4) defines an optimum ratio of the composite focal length $f_{1-3}$ of the first positive lens group $G_1$, the second negative lens group $G_2$, and the third positive lens $G_3$ to the composite focal length $f_{4-5}$ of the fourth negative lens group $G_4$ and the fifth positive lens group $G_5$ to achieve a sufficiently wide exposure area and to effect sufficient correction for distortion. Above the upper limit of this condition (4), it becomes difficult to secure a sufficiently wide exposure area and negative distortion will appear. In order to suppress appearance of positive distortion, the lower limit of the above condition (4) is preferably set to 1.5, as $1.5 < f_{1-3}/f_{4-5}$. For better correction for negative distortion, the upper limit of the above condition (4) is preferably set to 2.2, as $f_{1-3}/f_{4-5} < 2.2$.

On the basis of the above composition it is preferred that when I is an axial distance from the first object R to the first-object-side focal point F of the entire projection optical system and L is the distance from the first object R to the second object W, the following condition be satisfied:

$$1.0 < I/L. \quad (5)$$

The condition (5) defines an optimum ratio between the axial distance I from the first object R to the first-object-side focal point F of the entire projection optical system and the distance (object-image distance) L from the first object R (reticle etc.) to the second object W (wafer etc.). Here, the first-object-side focal point F of the entire projection optical system means an intersecting point of outgoing light from the projection optical system with the optical axis after collimated light beams are let to enter the projection optical system on the second object side in the paraxial region with respect to the optical axis of the projection optical system and when the light beams in the paraxial region are outgoing from the projection optical system. Below the lower limit of this condition (5) the first-object-side telecentricity of the projection optical system will become considerably destroyed, so that changes of magnification and distortion due to an axial deviation of the first object R will become large. As a result, it becomes difficult to faithfully project an image of the first object R at a desired magnification onto the second object W. In order to fully suppress the changes of magnification and distortion due to the axial deviation of the first object R, the lower limit of the above condition (5) is preferably set to 1.7, i.e., $1.7 < I/L$. Further, in order to correct a spherical aberration and a distortion of the pupil both in a good balance while maintaining the compact design of the projection optical system, the upper limit of the above condition (5) is preferably set to 6.8, i.e., $I/L < 6.8$.

In the present invention it is also preferred that the second lens group $G_2$ comprise a front lens $L_{2F}$ with a negative refracting power disposed as closest to the first object R and shaped with a concave surface to the second object W, a rear lens $L_{2R}$ of a meniscus shape with a negative refracting power disposed as closest to the second object W and shaped with a concave surface to the first object R, and an intermediate lens group $G_{2M}$ disposed between the front lens $L_{2F}$ in the second lens group $G_2$ and the rear lens $L_{2R}$ in the second lens group $G_2$, and that the intermediate lens group $G_{2M}$ comprise at least a first lens $L_{M1}$ with a positive refracting power, a second lens $L_{M2}$ with a negative refracting power, and a third lens $L_{M3}$ with a negative refracting power in order from the side of the first object R.

Here, in the second lens group $G_2$, the front lens $L_{2F}$ with the negative refracting power disposed as closest to the first object R and shaped with the concave surface to the second object W contributes to correction for curvature of field and coma, and the rear lens $L_{2R}$ of the meniscus shape with the negative refracting power disposed as closest to the second object W in the second lens group $G_2$ and shaped with the concave surface to the first object R contributes mainly to correction for coma. The rear lens $L_{2R}$ also contributes to correction for curvature of field. In the intermediate lens group $G_{2M}$ disposed between the front lens $L_{2F}$ and the rear lens $L_{2R}$, the first lens $L_{M1}$ with the positive refracting power contributes to correction for negative distortion generated by the second and third lenses $L_{M2}$, $L_{M3}$ with the negative refracting powers greatly contributing to correction for curvature of field. In the intermediate lens $G_{2M}$ appearance of coma can be suppressed because there are two or more lenses of negative refracting powers placed on the second object side of the first lens $L_{M1}$ with the positive refracting power.

Further, it is preferred that when $f_n$ is a composite focal length of from the second lens to the third lens in the second lens group $G_2$ and L is the distance from the first object R to the second object W, the following condition be satisfied:

$$-1.4 < f_n/L < -0.123. \quad (6)$$

The condition (6) defines an appropriate ratio of the composite focal length $f_n$ of from the second lens $L_{M2}$ with the negative refracting power to the third lens $L_{M3}$ with the negative refracting power in the intermediate lens group $G_{2M}$ in the second lens group $G_2$ to the distance (object-to-image distance) L from the first object R to the second object W. The composite focal length $f_n$ of from the second lens $L_{M2}$ with the negative refracting power to the third lens $L_{M3}$ with the negative refracting power in the intermediate lens group $G_{2M}$ in the second lens group $G_2$, stated herein, does not mean only the composite focal length of the two lenses, the second lens $L_{M2}$ and the third lens $L_{M3}$, but also means a composite focal length of two or more lenses of from the second lens $L_{M2}$ to the third lens $L_{M3}$ in the cases where a plurality of lenses are present between the second lens $L_{M2}$ and the third lens $L_{M3}$.

This condition (6) is for keeping the Petzval sum small as suppressing appearance of negative distortion. Below the lower limit of this condition (6), the refracting power becomes too weak of the negative sub-lens group including at least two negative lenses of from the second negative lens $L_{M2}$ to the third negative lens $L_{M3}$ in the intermediate lens group $G_{2M}$ in the second lens group $G_2$, which will result in giving rise to large positive Petzval sum and weakening the refracting power of the third lens group $G_3$, thus making it difficult to design the projection optical system in compact structure. For sufficiently compact design with good correction for Petzval sum, the lower limit of the above condition (6) is preferably set to −0.150, as −0.150<$r_n$/L.

Above the upper limit of this condition (6), the composite refracting power becomes too strong of the sub-lens group including at least two negative lenses of from the second negative lens $L_{M2}$ to the third negative lens $L_{M3}$ in the intermediate lens group $G_{2M}$ in the second lens group $G_2$, which makes it difficult to well correct negative distortion across a wide exposure area. For sufficient correction for distortion and coma, the upper limit of the above condition (6) is preferably set to −0.129, as $f_n$/L<−0.129.

For good correction mainly for third-order spherical aberration, the fifth lens group $G_5$ preferably comprises a negative lens $L_{54}$ of a biconcave shape, a first positive lens $L_{53}$ disposed as adjacent to the negative lens $L_{54}$ of the biconcave shape on the first object side and shaped with a convex surface to the second object W, and a second positive lens $L_{55}$ disposed as adjacent to the negative lens of the biconcave shape on the second object side and shaped with a convex surface to the first object R.

Further, it is also preferred that when $r_{5p1}$ is a radius of curvature of the convex surface of the first positive lens $L_{53}$ in the fifth lens group $G_5$ and $r_{5n1}$ is a radius of curvature of a concave surface on the first object side, of the negative lens $L_{54}$ of the biconcave shape in the fifth lens group $G_5$, the following condition be satisfied:

$$0<(r_{5p1}-r_{5n1})/(r_{5p1}+r_{5n1})<1. \quad (7)$$

It is also preferred that when $r_{5n2}$ is a radius of curvature of a concave surface on the second object side, of the negative lens $L_{54}$ of the biconcave shape in the fifth lens group $G_5$ and $r_{5p2}$ is a radius of curvature of the convex surface of the second positive lens $L_{55}$ in the fifth lens group $G_5$, the following condition be satisfied:

$$0<(r_{5p2}-r_{5n2})/(r_{5p2}+r_{5n2})<1. \quad (8)$$

The condition (7) and condition (8) define appropriate shapes of gas lenses formed on the both sides of the negative lens $L_{54}$ of the biconcave shape in the fifth lens group $G_5$ so as to effect good correction for third-order spherical aberration. Here, below the lower limit of condition (7) or condition (8), correction for third-order spherical aberration becomes insufficient; in contrast, above the upper limit of condition (7) or condition (8), the third-order spherical aberration becomes overcorrected, resulting in unpreferable correction in either case.

Here, for better correction for the third-order spherical aberration, the lower limit of the condition (7) is more preferably set to 0.01, as 0.01<$(r_{5p1}-r_{5n1})/(r_{5p1}+r_{5n1})$, and the upper limit of condition (7) is more preferably set to 0.7, as $(r_{5p1}-r_{5n1})/(r_{5n1}+r_{5n1})$<0.7. For better correction for the third-order spherical aberration, the lower limit of the condition (8) is more preferably set to 0.01, as 0.01<$(r_{5p2}-r_{5n2})/(r_{5p2}+r_{5n2})$, and the upper limit of the condition (8) is more preferably set to 0.7, as $(r_{5p2}-r_{5n2})/(r_{5p2}+r_{5n2})$<0.7. Further better correction for the third-order spherical aberration can be expected when the above condition (7) and condition (8) both are satisfied.

Here, it is preferred that the negative lens $L_{54}$ of the biconcave shape, the first positive lens $L_{53}$ disposed as adjacent on the first object side to the negative lens $L_{54}$ of the biconcave shape and shaped with the convex surface to the second object W, and the second positive lens $L_{55}$ disposed as adjacent on the second object side to the negative lens $L_{54}$ of the biconcave shape and shaped with the convex surface to, the first object R be disposed between at least one positive lens, for example lens $L_{52}$, in the fifth lens group $G_5$ and at least one positive lens, for example lens $L_{56}$, in the fifth lens $G_5$. This constitution can suppress appearance of higher-order spherical aberration, which tends to appear as the numerical aperture increases. As a result, a concave lens will not be necessary at a space S2 between the lens $L_{56}$ and the lens $L_{57}$.

It is also preferred that when $f_3$ is the focal length of the third lens group $G_3$ and $f_5$ is the focal length of the fifth lens group $G_5$, the following condition be satisfied:

$$0.80<f_3/f_5<1.00. \quad (9)$$

The above condition (9) defines a preferred ratio of refracting powers of the third lens group $G_3$ and the fifth lens group $G_5$. First, an arrangement of nearly equal refracting powers of the third lens group $G_3$ and the fifth lens group $G_5$ can suppress appearance of asymmetric aberration (particularly, coma and distortion); and the arrangement that the refracting power of the fifth lens group $G_5$ is slightly weaker than that of the third lens group $G_3$, as in the condition (9), can suppress appearance of negative distortion in particular.

Here, below the lower limit of condition (9), positive distortion and coma will appear, which is not preferred. Above the upper limit of condition (9), negative distortion and coma will appear, which is not preferred.

It is also preferred that the fourth lens group $G_4$ comprise a front lens $L_{41}$ with a negative refracting power disposed as closest to the first object R and shaped with a concave surface to the second object W, a rear lens $L_{43}$ with a negative refracting power disposed as closest to the second object w and shaped with a concave surface to the first object R, and at least one negative lens $L_{42}$ disposed between the front lens $L_{41}$ in the fourth lens group $G_4$ and the rear lens $L_{43}$ in the fourth lens group $G_4$. Here, the Petzval sum and spherical aberration can be well corrected by the arrangement in which one or more negative lenses are disposed between the front lens $L_{41}$ and the rear lens $L_{43}$ in the fourth lens group $G_4$. Further, it is further preferred that when $r_{4F}$ is a radius of curvature of a second-object-side surface of the front lens $L_{41}$ disposed as closest to the first object R in the fourth lens group $G_4$ and $r_{4R1}$ a radius of curvature of a first-object-side surface of the rear lens $L_{43}$ disposed as closest to the second object W in the fourth lens $G_4$, the following condition be satisfied:

$$1.03 < |(r_{4F} - r_{4R1})/(r_{4F} + r_{4R1})|. \quad (10)$$

Below the lower limit of condition (10), coma will appear, thus not preferred. Further, in order to suppress appearance of coma, the lower limit of condition (10) is preferably set to 1.10, as $1.10 < |(r_{4F} - r_{4R1})/(r_{4F} + r_{4R1})|$. It is also preferred that when D is an axial distance from a second-object-side lens surface of the third lens $L_{M3}$ with the negative refracting power in the intermediate lens group $G_{2M}$ in the second lens group $G_2$ to a first-object-side lens surface of the rear lens $L_{2R}$ in the second lens group $G_2$ and L is the distance from the first object R to the second object W, the following condition be satisfied:

$$0.05 < D/L < 0.4. \quad (11)$$

Below the lower limit of condition (11), it becomes difficult to secure a sufficient back focus on the second object side and to well correct for the Petzval sum. Above the upper limit of condition (11), large coma and negative distortion will appear. Further, for example, in order to avoid mechanical interference between a reticle stage for holding a reticle R as a first object and the first lens group $G_1$, there are cases that a sufficient space S1 is desired to be secured between the first object R and the first lens group $G_1$, but above the upper limit of condition (11), there is a problem that it becomes difficult to secure the sufficient space S1.

It is also preferred that when $f_4$ is the focal length of the fourth lens group $G_4$ and L is the distance from the first object R to the second object W, the following condition be satisfied:

$$-0.098 < f_4/L < -0.005. \quad (12)$$

Below the lower limit of condition (12), correction for spherical aberration becomes difficult, thus not preferred. Also, above the upper limit of condition (12), coma will appear, thus not preferred. For good correction for spherical aberration and Petzval sum, the lower limit of condition (12) is preferably set to −0.078, as $-0.078 < f_4/L$, and for suppressing appearance of coma, the upper limit of condition (12) is preferably set to −0.047, as $f_4/L < -0.047$.

It is also preferred that when $f_2$ is the focal length of the second lens group $G_2$ and L is the distance from the first object R to the second object W, the following condition be satisfied:

$$-0.8 < f_2/L < -0.050. \quad (13)$$

Here, below the lower limit of condition (13), positive Petzval sum will appear, thus not preferred. Also, above the upper limit of condition (13), negative distortion will appear, thus not preferred. For better correction for Petzval sum, the lower limit of condition (13) is preferably set to −0.16, as $-0.16 < f_2/L$.

It is also preferred that the fourth lens group $G_4$ comprise a front lens $L_{41}$ with a negative refracting power disposed as closest to the first object R and shaped with a concave surface to the second object W, a rear lens $L_{43}$ with a negative refracting power disposed as closest to the second object w and shaped with a concave surface to the first object R, and at least one negative lens $L_{42}$ disposed between the front lens $L_{41}$ in the fourth lens group $G_4$ and the rear lens $L_{43}$ in the fourth lens group $G_4$, and that when $r_{4R1}$ is a radius of curvature of a first-object-side surface of the rear lens $L_{43}$ disposed as closest to the second object W in the fourth lens group $G_4$ and $r_{4R2}$ is a radius of curvature of a second-object-side surface of the rear lens $L_{43}$, the following condition be satisfied:

$$-1.00 \leq (r_{4R1} - r_{4R2})/(r_{4R1} + r_{4R2}) < 0. \quad (14)$$

Below the lower limit of condition (14), the negative, rear lens $L_{43}$ located as closest to the second object W in the fourth lens group $G_4$ becomes of a biconcave shape to generate higher-order spherical aberration; in contrast, above the upper limit of condition (14), the negative, rear lens $L_{43}$ located as closest to the second object W in the fourth lens group $G_4$ will have a positive refracting power, so that correction of Petzval sum tends to become difficult.

It is also preferred that the first lens $L_{M1}$ with the positive refracting power in the intermediate lens group $G_{2M}$ in the second lens group $G_2$ have a lens shape with a convex surface to the second object W and that when $\Phi_{21}$ is a refracting power of the second-object-side lens surface of the first lens $L_{M1}$ with the positive refracting power in the intermediate lens group $G_{2M}$ in the second lens group $G_2$ and L is the distance from the first object R to the second object W, the following condition be satisfied:

$$0.54 < 1/(\Phi_{21} \cdot L) < 10, \quad (15)$$

The refracting power of the second-object-side lens surface, stated herein, of the first lens $L_{M1}$ with positive refracting power in the intermediate lens group $G_{2M}$ is given by the following formula when a refractive index of a medium for the first lens $L_{M1}$ is $n_1$, a refracting index of a medium in contact with the second-object-side lens surface of the first lens $L_{M1}$ is $n_2$, and a radius of curvature of the second-object-side lens surface of the first lens $L_{M1}$ is $r_{21}$.

$$\Phi_{21} = (n_2 - n_1)/r_{21}$$

Below the lower limit of condition (15), higher-order distortion will appear; in contrast, above the upper limit of condition (15), the first lens group $G_1$ needs to more overcorrect distortion, which will generate spherical aberration of pupil, thus not preferred.

It is also preferred that when $f_{2F}$ is a focal length of the front lens $L_{2F}$ with the negative refracting power disposed as closest to the first object R in the second lens group $G_2$ and shaped with the concave surface to the second object W and $f_{2R}$ is a focal length of the rear lens $L_{2R}$ with the negative refracting power disposed as closest to the second object w in the second lens group $G_2$ and shaped with the concave surface to the first object R, the following condition be satisfied:

$$0 \leq f_{2F}/f_{2R} < 18. \quad (16)$$

The condition (16) defines an optimum ratio between the focal length $f_{2R}$ of the rear lens $L_{2RF}$ in the second lens group $G_2$ and the focal length $f_{2F}$ of the front lens $L_{2F}$ in the second lens group $G_2$. Below the lower limit and above the upper limit of this condition (16), the balance of the refracting power of the first lens group $G_1$ or the third lens group $G_3$ is destroyed, it becomes difficult to well correct distortion or to simultaneously well correct Petzval sum and astigmatism.

For better correction for Petzval sum, the intermediate lens group $G_{2M}$ in the second lens group $G_2$ preferably has a negative refracting power.

Also, for good correction for Petzval sum, it is preferred that only the second lens $L_{M2}$ and the third lens $L_{M3}$ have negative refracting powers in the intermediate lens group $G_{2M}$. It is preferred that when $f_{22}$ is the focal length of the second lens $L_{M2}$ with the negative refracting power in the second lens group $G_2$ and $f_{23}$ the focal length of the third lens $L_{M3}$ with the negative refracting power in the second lens group $G_2$, the following condition (17) be satisfied:

$0.7 < f_{22}/f_{23}.$  (17)

Below the lower limit of condition (17), the refracting power of the second negative lens $L_{M2}$ becomes relatively stronger than the refracting power of the third negative lens $L_{M3}$, and the second negative lens $L_{M2}$ generates large coma and negative distortion. For good correction for Petzval sum, the lower limit of the above condition (17) is preferably set to 1.6, as $1.6 < f_{22}/f_{23}$. For suppressing appearance of coma and negative distortion, the upper limit of the above condition (17) is preferably set to 18, as $f_{22}/f_{23} < 18$.

For the above lens groups $G_1$–$G_5$ to achieve satisfactory aberration correction functions, specifically, they are desired to be constructed in the following arrangements.

First, for the first lens group $G_1$ to have a function to suppress appearance of higher-order distortion and appearance of spherical aberration of pupil, the first lens group $G_1$ preferably has at least two positive lenses; for the second lens group $G_2$ to suppress appearance of coma while correcting Petzval sum, the second lens group $G_2$ preferably has at least two negative lenses. For the third lens group $G_3$ to have a function to suppress degradation of spherical aberration and Petzval sum, the third lens group $G_3$ preferably has at least three positive lenses; further, for the fourth lens group $G_4$ to have a function to suppress appearance of coma as correcting Petzval sum, the fourth lens group $G_4$ preferably has at least three negative lenses. For the fifth lens group $G_5$ to have a function to suppress appearance of negative distortion and spherical aberration, the fifth lens group $G_5$ preferably has at least five positive lenses. Further, for the fifth lens group $G_5$ to have a function to correct spherical aberration, the fifth lens group $G_5$ preferably has at least one negative lens.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

Figure 1:
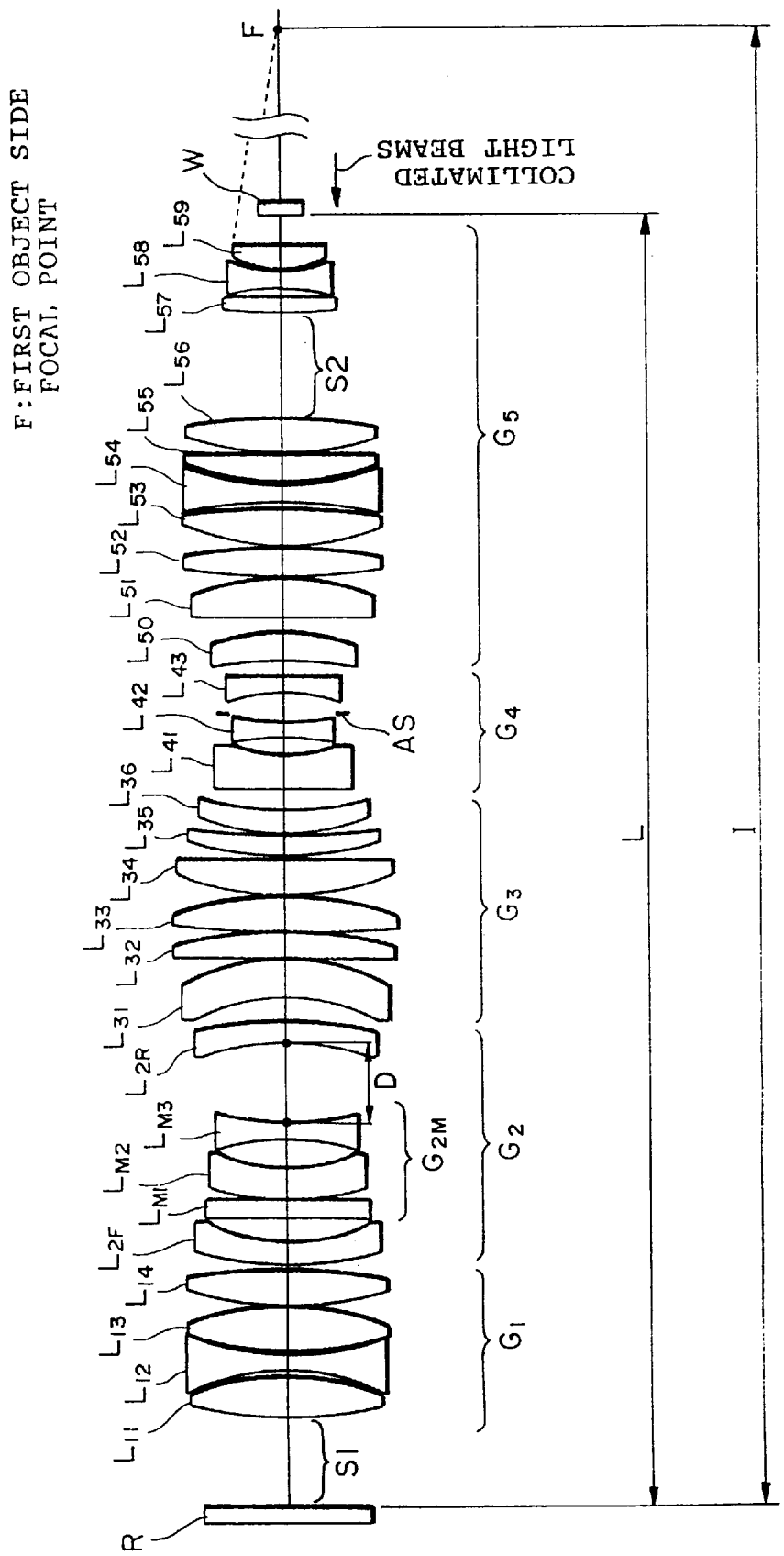
FIG. 1 is a drawing to show parameters defined in embodiment of the present invention.
Figure 2:
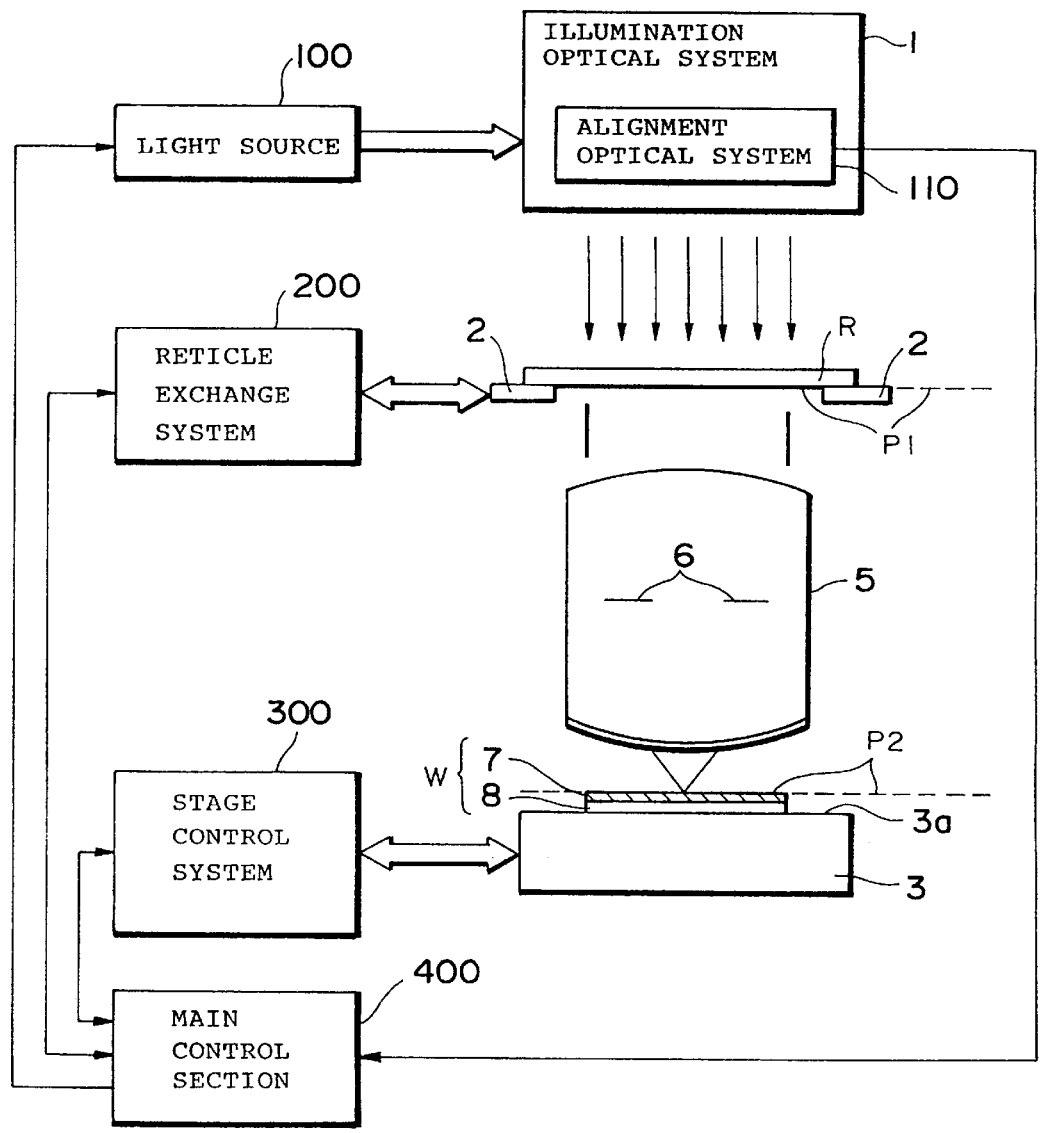
FIG. 2 is a drawing to show schematic structure of an expose apparatus to which the projection optical system according to the present invention is applied.

Various embodiments of the projection optical system according to the present invention will be described with reference to the drawings. In the examples, the present invention is applied to the projection optical system in the projection exposure apparatus for projecting an image of patterns of reticle onto a wafer coated with a photoresist. FIG. 2 shows a basic structure of the exposure apparatus according to the present invention. As shown in FIG. 2, an exposure apparatus of the present invention comprises at least a wafer stage 3 allowing a photosensitive substrate w to be held on a main surface 3a thereof, an illumination optical system 1 for emitting exposure light of a predetermined wavelength and transferring a predetermined pattern of a mask (reticle R) onto the substrate W, a light source 100 for supplying an exposure light to the illumination optical system 1, a projection optical system 5 provided between a first surface P1 (object plane) on which the mask R is disposed and a second surface P2 (image plane) to which a surface of the substrate W is corresponded, for projecting an image of the pattern of the mask R onto the substrate W. The illumination optical system 1 includes an alignment optical system 110 for adjusting a relative positions between the mask R and the wafer W, and the mask R is disposed on a reticle stage 2 which is movable in parallel with respect to the main surface of the wafer stage 3. A reticle exchange system 200 conveys and changes a reticle (mask R) to be set on the reticle stage 2. The reticle exchange system 200 includes a stage driver for moving the reticle stage 2 in parallel with respect to the main surface 3a of the wafer stage 3. The projection optical system 5 has a space permitting an aperture stop 6 (AS) to be set therein. The sensitive substrate W comprises a wafer 8 such as a silicon wafer or a glass plate, etc., and a photosensitive material 7 such as a photoresist or the like coating a surface of the wafer 8. The wafer stage 3 is moved in parallel with respect to a object plane P1 by a stage control system 300. Further, since a main control section 400 such as a computer system controls the light source 100, the reticle exchange system 200, the stage control system 300 or the like, the exposure apparatus can perform a harmonious action as a whole.

The techniques relating to an exposure apparatus of the present invention are described, for example, in U.S. patent applications Ser. Nos. 255,927, 260,398, 299,305, U.S. Pat. Nos. 4,497,015, 4,666,273, 5,194,893, 5,253,110, 5,333,035, 5,365,051, 5,379,091, or the like. The reference of U.S. patent application Ser. No. 255,927 teaches an illumination optical system (using a laser source) applied to a scan type exposure apparatus. The reference of U.S. patent application Ser. No. 260,398 teaches an illumination optical system (using a lamp source) applied to a scan type exposure apparatus. The reference of U.S. patent application Ser. No.

299,305 teaches an alignment optical system applied to a scan type exposure apparatus. The reference of U.S. Pat. No. 4,497,015 teaches an illumination optical system (using a lamp source) applied to a scan type exposure apparatus. The reference of U.S. Pat. No. 4,666,273 teaches a step-and repeat type exposure apparatus capable of using the projection optical system of the present invention. The reference of U.S. Pat. No. 5,194,893 teaches an illumination optical system, an illumination region, mask-side and reticle-side interferometers, a focusing optical system, alignment optical system, or the like. The reference of U.S. Pat. No. 5,253,110 teaches an illumination optical system (using a laser source) applied to a step-and-repeat type exposure apparatus. The '110 reference can be applied to a scan type exposure apparatus. The reference of U.S. Pat. No. 5,333,035 teaches an application of an illumination optical system applied to an exposure apparatus. The reference of U.S. Pat. No. 5,365,051 teaches a auto-focusing system applied to an exposure apparatus. The reference of U.S. Pat. No. 5,379,091 teaches an illumination optical system (using a laser source) applied to a scan type exposure apparatus.

Each embodiment according to the present invention will be described in detail.

Light supplied from the illumination optical system 1 illuminates the reticle R to form an image of the light source 100 at the pupil position of the projection optical system 5 (the position of aperture stop AS 6). Namely, the illumination optical system 1 uniformly illuminates the reticle R under Köhler illumination. Then the pattern image of reticle R illuminated under Köhler illumination is projected (or transferred) onto the wafer W.

The present embodiment shows an example of the projection optical system in which the light source disposed inside the illumination optical system 1 is a mercury lamp for supplying the i-line (365 nm). The structure of the projection optical system in each embodiment will be described by reference to FIG. 3 to FIG. 6. FIG. 3 to FIG. 6 are lens structural drawings of the projection optical systems in the first to fourth embodiments, respectively, according to the present invention.

As shown in FIG. 3 to FIG. 6, the projection optical system in each embodiment has a first lens group $G_1$ with a positive refracting power, a second lens group $G_2$ with a negative refracting power, a third lens group $G_3$ with a positive refracting power, a fourth lens group $G_4$ with a negative refracting power, and a fifth lens group $G_5$ with a positive refracting power in order from the side of reticle R as a first object, is arranged as substantially telecentric on the object side (reticle R side) and on the image side (wafer W side), and has a reduction magnification.

In the projection optical system in each of the embodiments shown in FIG. 3 to FIG. 6, an object-to-image distance (a distance along the optical axis from the object plane to the image plane, or a distance along the optical axis from the reticle R to wafer W) L is 1000, an image-side numerical aperture NA is 0.3, a projection magnification β is 1/2.5, and a diameter of an exposure area on the wafer W is 51.9.

Figure 3:
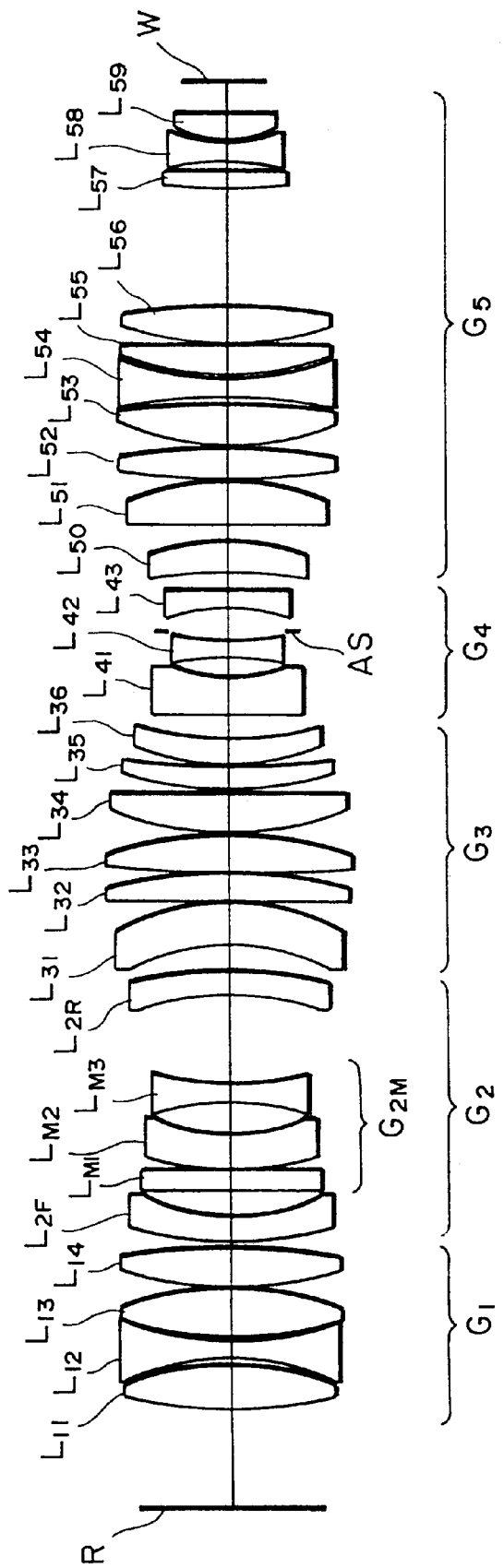
FIG. 3 is a lens arrangement drawing of the projection optical system in the first embodiment according to the present invention.

First described is a specific lens arrangement of the first embodiment shown in FIG. 3. The first lens group $G_1$ has a positive lens (positive lens of a biconvex shape) $L_{11}$ with a convex surface to the image, a negative lens of a biconcave shape $L_{12}$, a positive lens (positive lens of a biconvex shape) $L_{13}$ with a convex surface to the object, and a positive lens of a biconvex shape $L_{14}$ in order from the object side. The image means a pattern image which is projected onto the image plane P2 when exposure light from the illumination optical system 1 passes through the reticle R, and object means a pattern on the object plane P1 of the reticle R.

The second lens group $G_2$ has a negative lens (negative meniscus lens: front lens) $L_{2F}$ disposed as closest to the object and shaped with a concave surface to the image, a negative meniscus lens (rear lens) $L_{2R}$ disposed as closest to the image and shaped with a concave surface to the object, and an intermediate lens group $G_{2M}$ with a negative refracting power disposed between these negative lens $L_{2F}$ and negative lens $L_{2R}$. This intermediate lens group $G_{2M}$ has a positive lens (positive lens of a biconvex shape: first lens) $L_{M1}$ shaped with a convex surface to the object, a negative meniscus lens (second lens) $L_{M2}$ shaped with a concave surface to the image, and a negative lens (negative lens of a biconcave shape: third lens) $L_{M3}$ shaped with a concave surface to the image in order from the object side.

The third lens group $G_3$ has two positive lenses (positive meniscus lenses) $L_{31}$, $L_{32}$ each shaped with a convex surface to the image, a positive lens (positive lens of a biconvex shape) $L_{33}$ shaped with a convex surface to the image, a positive lens (positive lens of a biconvex shape) $L_{34}$ shaped with a convex surface to the object, and two positive lenses (positive meniscus lenses) $L_{35}$, $L_{36}$ each shaped with a convex surface to the object in order from the object side.

The fourth lens group $G_4$ has a negative lens (negative lens of a biconcave shape: front lens) $L_{41}$ disposed as closest to the object and shaped with a concave surface to the image, a negative lens (negative meniscus lens: rear lens) $L_{43}$ disposed as closest to the image and shaped with a concave surface to the object, and a negative lens $L_{42}$ of a biconcave shape disposed between these front lens $L_{41}$ and rear lens $L_{43}$.

The fifth lens group $G_5$ has two positive lenses (positive meniscus lenses) $L_{50}$, $L_{51}$ each shaped with a convex surface to the image, a positive lens (positive lens of a biconvex shape) $L_{52}$ shaped with a convex surface to the image, a positive lens (positive lens of a biconvex shape: first positive lens) $L_{53}$ shaped with a convex surface to the image, a negative lens $L_{54}$ of a biconvex shape, a positive lens (positive meniscus lens: second positive lens) $L_{55}$ shaped with a convex surface to the object, a positive lens (positive lens of a biconvex shape) $L_{56}$ shaped with a convex surface to the object, a positive lens (positive lens of a biconvex shape) $L_{57}$ shaped with a convex surface to the image, a negative lens $L_{58}$ of a biconvex shape, and a positive lens (positive meniscus lens) $L_{59}$ shaped with a convex surface to the object.

In the present embodiment, an aperture stop AS is disposed between the image-side concave surface of the front lens $L_{41}$ and the object-side concave surface of the rear lens $L_{43}$ in the fourth lens group $G_4$.

In the first lens group $G_1$ in the present embodiment, the image-side convex surface of the positive biconvex lens $L_{11}$ and the object-side concave surface of the negative biconcave lens $L_{12}$ have nearly equal curvatures and are arranged as relatively close to each other. Further, in the first lens group $G_1$, the image-side concave surface of the negative biconcave lens $L_{12}$ and the object-side convex surface of the positive biconvex lens $L_{13}$ have nearly equal curvatures and are arranged as relatively close to each other. In the present embodiment, each set of these lens surfaces arranged as close to each other are corrected for higher-order distortion.

Since in the present embodiment the front lens $L_{2F}$ in the second lens group $G_2$ is formed in a meniscus shape and shaped with a concave surface to the image, coma can be reduced. Since in the present embodiment the first lens $L_{M1}$ with the positive refracting power in the intermediate lens group $G_{2M}$ in the second lens group $G_2$ is formed in a biconvex shape and shaped with a convex surface to the image and another convex surface to the object, appearance of spherical aberration of pupil can be suppressed.

Since the fourth lens group $G_4$ in the present embodiment is so arranged that the negative lens (front lens) $L_{41}$ shaped with the concave surface to the image is disposed on the object side of the aperture stop AS and the negative lens (rear lens) $L_{43}$ with the concave surface to the object is disposed on the image side of the aperture stop AS, appearance of asymmetric aberration, particularly coma, can be suppressed.

Since in the present embodiment the lens groups of from the third lens group $G_3$ to the fifth lens group $G_5$ have a nearly symmetric refractive-power arrangement with respect to the aperture stop AS located in the fourth lens group, appearance of asymmetric aberration, particularly coma and distortion, can be suppressed.

Since in the present embodiment the first positive lens $L_{53}$ in the fifth lens group $G_5$ has the convex surface opposed to the negative lens $L_{54}$ of the biconcave shape and the other lens surface on the opposite side to the negative lens $L_{54}$ is also a convex surface, higher-order spherical aberration can be prevented from arising with an increase of numerical aperture. In the present embodiment, spherical aberration and astigmatism is corrected by arranging the positive lens $L_{57}$ with the convex surface to the image, the negative lens of the biconcave shape $L_{58}$, and the positive lens $L_{59}$ with the convex surface to the object near the image plane.

Figure 4:
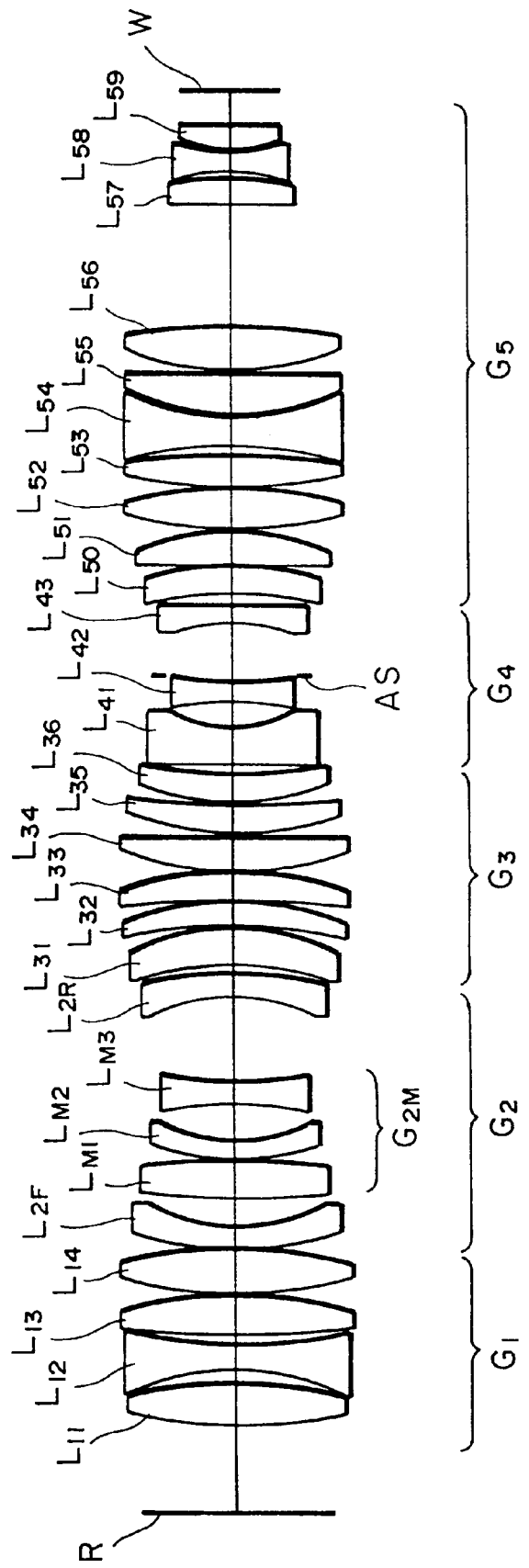
FIG. 4 is a lens arrangement drawing of the projection optical system in the second embodiment according to the present invention.

The lens arrangement of the second embodiment shown in FIG. 4 is similar to that of the first embodiment as shown in FIG. 3 and described above. The third lens group in the second embodiment is different from that in the first embodiment in that the third lens group $G_3$ is composed of three positive lenses (positive meniscus lenses) $L_{31}$, $L_{32}$, $L_{33}$ each shaped with a convex surface to the image, a positive lens (positive lens of a biconvex shape) $L_{34}$ shaped with a convex surface to the object, and two positive lenses (positive meniscus lenses) $L_{35}$, $L_{36}$ each shaped with a convex surface to the object in order from the object side, but the function thereof is the same as that of the first embodiment as described above.

Also, the fourth lens group in the second embodiment is different from that of the first embodiment in that the fourth lens group $G_4$ has a negative lens (negative meniscus lens: front lens) $L_{41}$ disposed as closest to the object and shaped with a concave surface to the image, a negative lens (negative meniscus lens: rear lens) $L_{43}$ disposed as closest to the image and shaped with a concave surface to the object, and a negative lens $L_{42}$ of a biconcave shape disposed between these front lens $L_{41}$ and rear lens $L_{42}$, but the function thereof is the same.

Further, in the second embodiment, the fifth lens group $G_5$ is different from that in the first embodiment in that the fifth lens group $G_5$ is composed of two positive lenses (positive meniscus lenses) $L_{50}$, $L_{51}$ each shaped with a convex surface to the image, a positive lens $L_{52}$ of a biconvex shape, a positive lens (positive lens of a biconvex shape: first positive lens) $L_{53}$ shaped with a convex surface to the image, a negative lens $L_{54}$ of a biconvex shape, a positive lens (positive lens of a biconvex shape: second positive lens) $L_{55}$ shaped with a convex surface to the object, a positive lens (positive lens of a biconvex shape) $L_{56}$ shaped with a convex surface to the object, a positive lens (positive meniscus lens) $L_{57}$ shaped with a convex surface to the image, a negative lens $L_{58}$ of a biconcave shape, and a positive lens (positive meniscus lens) $L_{59}$ shaped with a convex surface to the object in order from the object side.

Also in the present embodiment, the aperture stop AS is disposed between the image-side concave surface of the front lens $L_{41}$ and the object-side concave surface of the rear lens $L_{43}$ in the fourth lens group $G_4$.

Since the present embodiment is so arranged that the first positive lens $L_{53}$ in the fifth lens group $G_5$ has the convex surface opposed to the negative biconcave lens $L_{54}$ and the other lens surface on the opposite side to the negative lens $L_{54}$ is also a convex surface and that the second positive lens $L_{55}$ in the fifth lens group has the convex surface opposed to the negative biconcave lens $L_{54}$ and the other lens surface on the opposite side to the negative lens $L_{54}$ is also the convex surface, higher-order spherical aberration can be prevented from appearing with an increase of numerical aperture. Since the present embodiment is so arranged that the second positive lens $L_{55}$ in the fifth lens group has the convex surface opposed to the negative biconcave lens $L_{54}$ and the other lens surface on the opposite side to the negative lens $L_{54}$ is also the convex surface, the higher-order spherical aberration can be prevented from appearing with an increase of numerical aperture. Further, spherical aberration and astigmatism is corrected in the present embodiment by arranging the positive lens $L_{57}$ with the convex surface to the image, the negative lens $L_{58}$ of the biconcave shape, and the positive lens $L_{59}$ with the convex surface to the object near the image plane.

The first and second lens groups $G_1$, $G_2$ and the fourth lens group $G_4$ in the second embodiment achieve the same functions as those in the first embodiment as described above.

Figure 5:
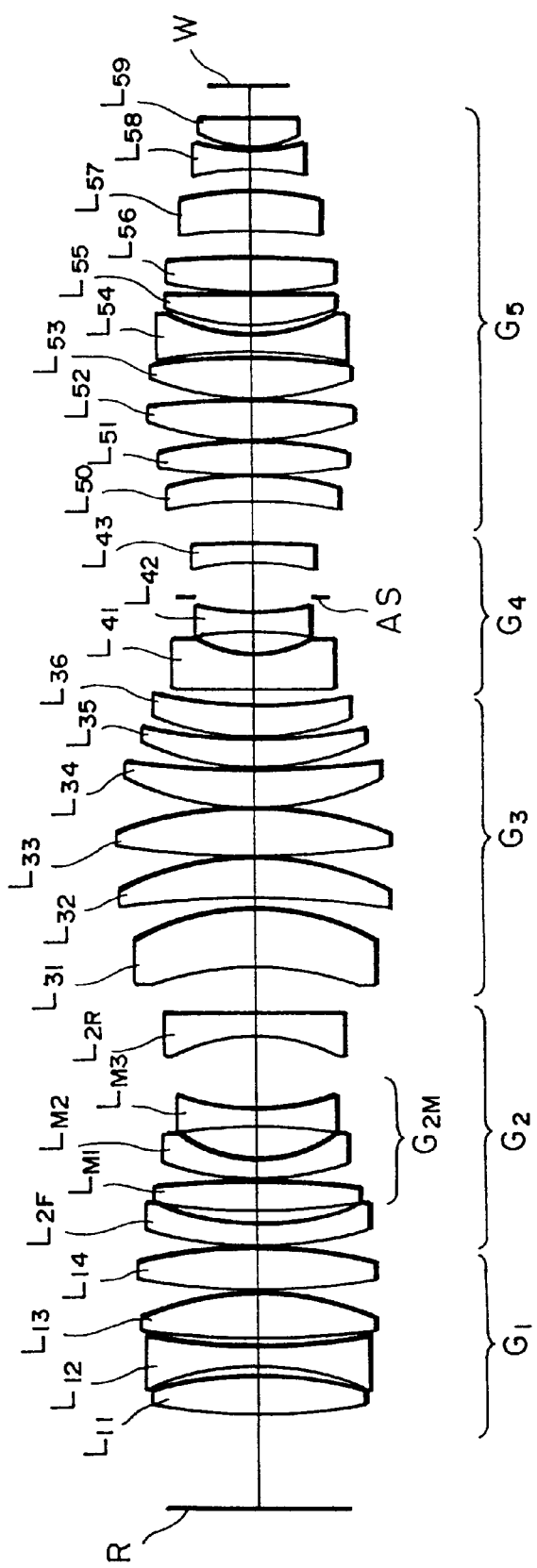
FIG. 5 is a lens arrangement drawing of the projection optical system in the third embodiment according to the present invention.

The lens arrangement of the third embodiment shown in FIG. 5 is similar to that of the first embodiment as shown in FIG. 3 and described previously. Here, the third lens group $G_3$ in the third embodiment is different from that of the first embodiment in that the third lens group $G_3$ is composed of two positive lenses (positive meniscus lenses) $L_{31}$, $L_{32}$ each shaped with a convex surface to the image, a positive lens (positive lens of a biconvex shape) $L_{33}$, a positive lens (positive meniscus lens) $L_{34}$ shaped with a convex surface to the object, and two positive lenses (positive meniscus lenses) $L_{35}$, $L_{36}$ each shaped with a convex surface to the object in order from the object side.

In the third embodiment, the fourth lens group is also different from that of the first embodiment in that the fourth lens group $G_4$ has a negative lens (negative meniscus lens: front lens) $L_{41}$ disposed as closest to the object and shaped with a concave surface to the image, a negative lens (negative meniscus lens: rear lens) $L_{43}$ arranged as closest to the image and shaped with a concave surface to the object, and a negative lens $L_{42}$ of a biconcave shape disposed between these front lens $L_{41}$ and rear lens $L_{43}$.

The fifth lens group $G_5$ in the third embodiment has a positive meniscus lens $L_{50}$ shaped with a convex surface to the image, two positive lenses (positive lenses of biconvex shape) $L_{51}$, $L_{52}$ each shaped with a convex surface to the image, a positive lens (positive lens of a biconvex shape: first positive lens) $L_{53}$ shaped with a convex surface to the image, a negative lens $L_{54}$ or a biconcave shape, a positive lens (positive meniscus lens: second positive lens) $L_{55}$ shaped with a convex surface to the object, a positive lens (positive lens of a biconvex shape) $L_{56}$ shaped with a convex surface to the object, a positive lens (positive meniscus lens)

$L_{57}$ shaped with a convex surface to the image, a negative lens $L_{58}$ of a biconcave shape, and a positive lens (positive meniscus lens) $L_{59}$ shaped with a convex surface to the object in order from the object side.

Also in the present embodiment, the aperture stop AS is disposed between the image-side concave surface of the front lens $L_{41}$ and the object-side concave surface of the rear lens $L_{43}$ in the fourth lens group $G_4$.

Since the present embodiment is so arranged that the first positive lens $L_{53}$ in the fifth lens group $G_5$ has a convex surface opposed to the negative biconcave lens $L_{54}$ and the other lens surface on the opposite side to the negative lens $L_{54}$ is also a convex surface, the higher-order spherical aberration can be prevented from arising with an increase of numerical aperture. The first to fourth lens groups $G_1$ to $G_4$ in the present embodiment have the same functions as those in the first embodiment as described previously.

Figure 6:
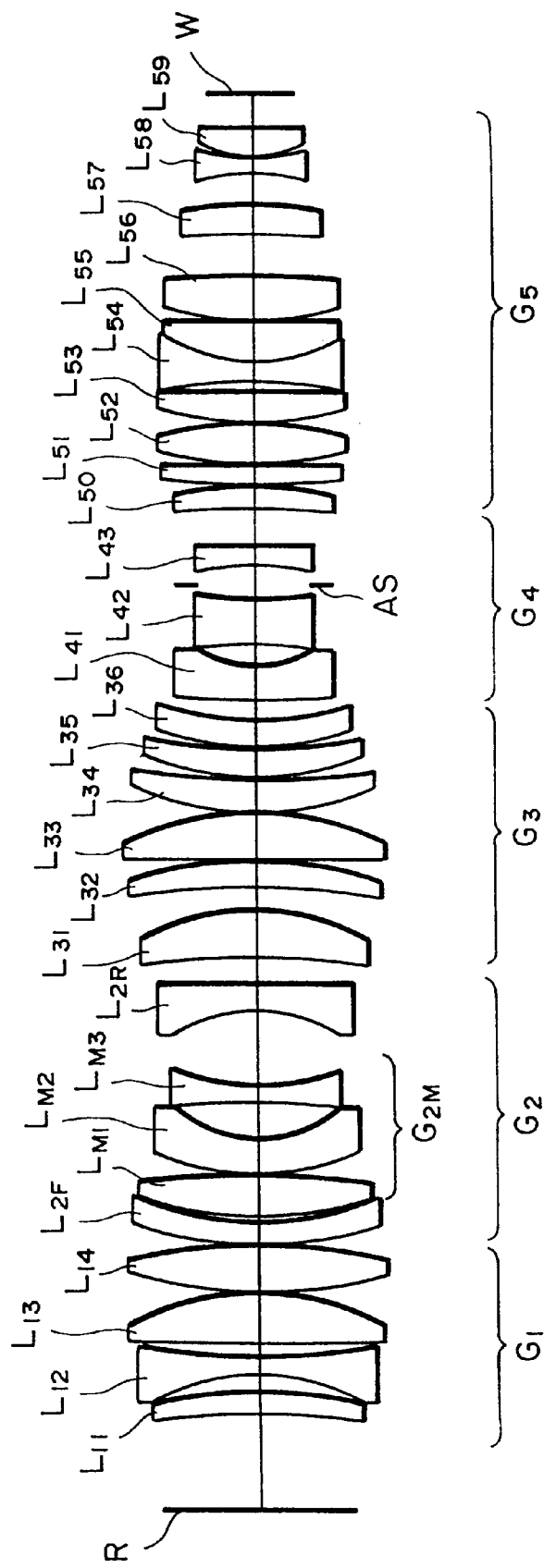
FIG. 6 is a lens arrangement drawing of the projection optical system in the fourth embodiment according to the present invention.
Figure 7:
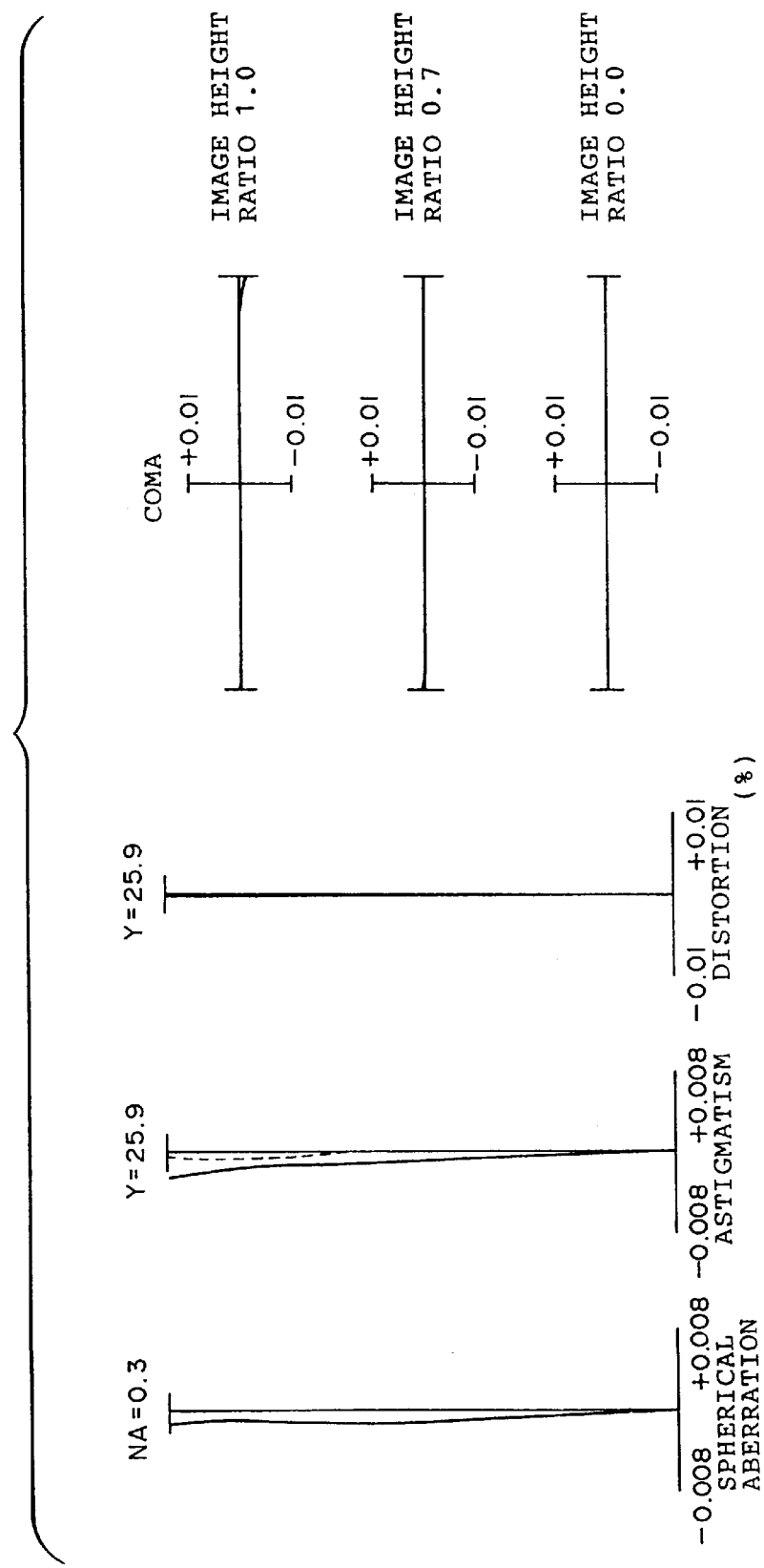
FIG. 7 is aberration diagrams to show aberrations in the projection optical system of the first embodiment as shown in FIG. 3.
Figure 8:
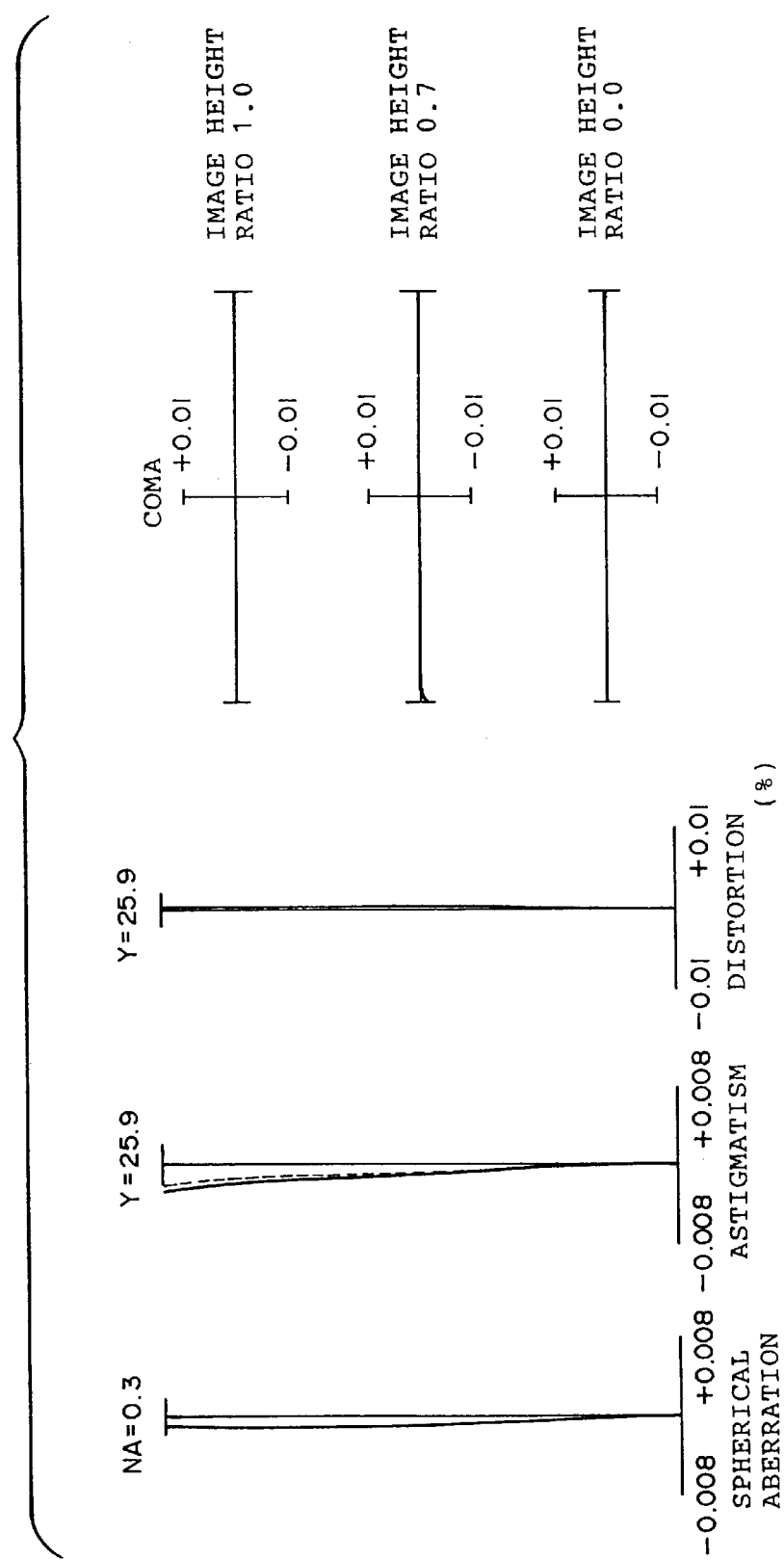
FIG. 8 is aberration diagrams to show aberrations in the projection optical system of the second embodiment as shown in FIG. 4.
Figure 9:
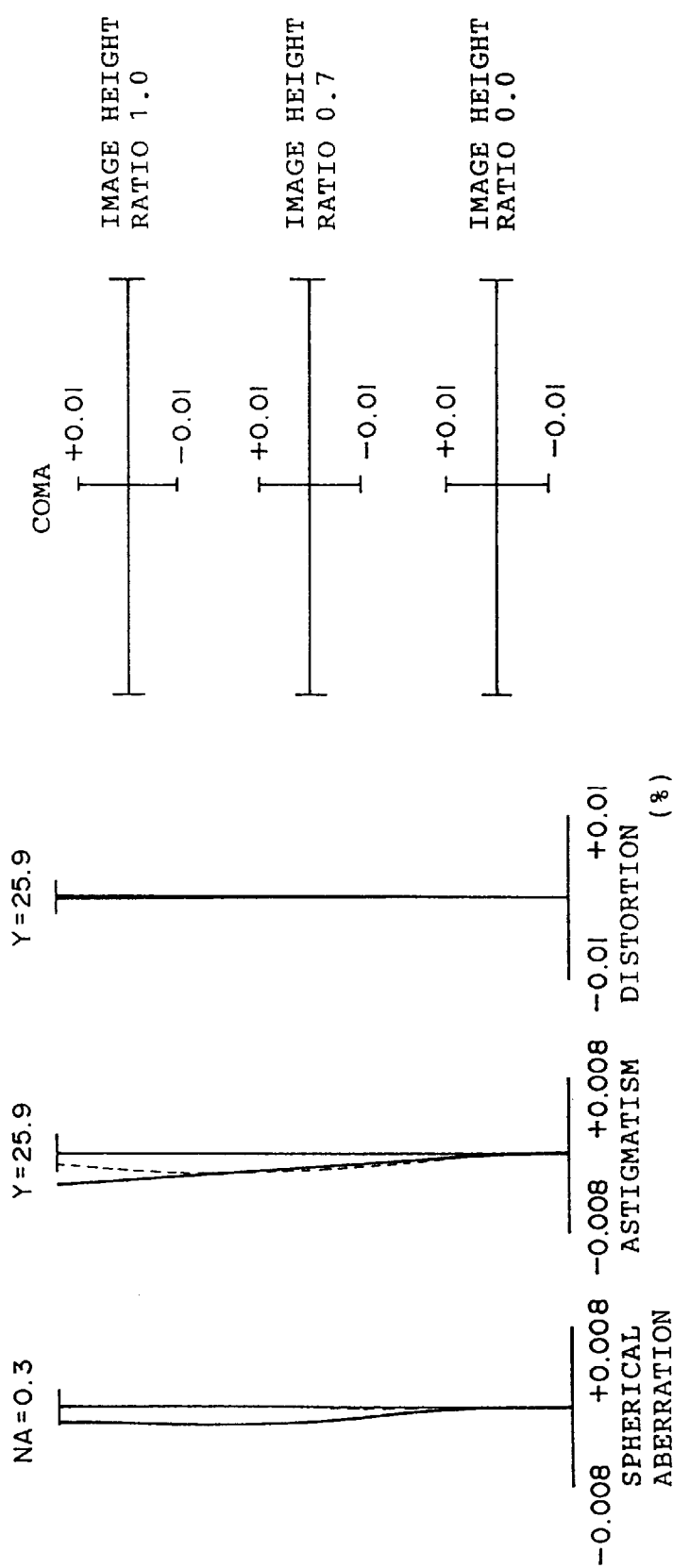
FIG. 9 is aberration diagrams to show aberrations in the projection optical system of the third embodiment as shown in FIG. 5.
Figure 10:
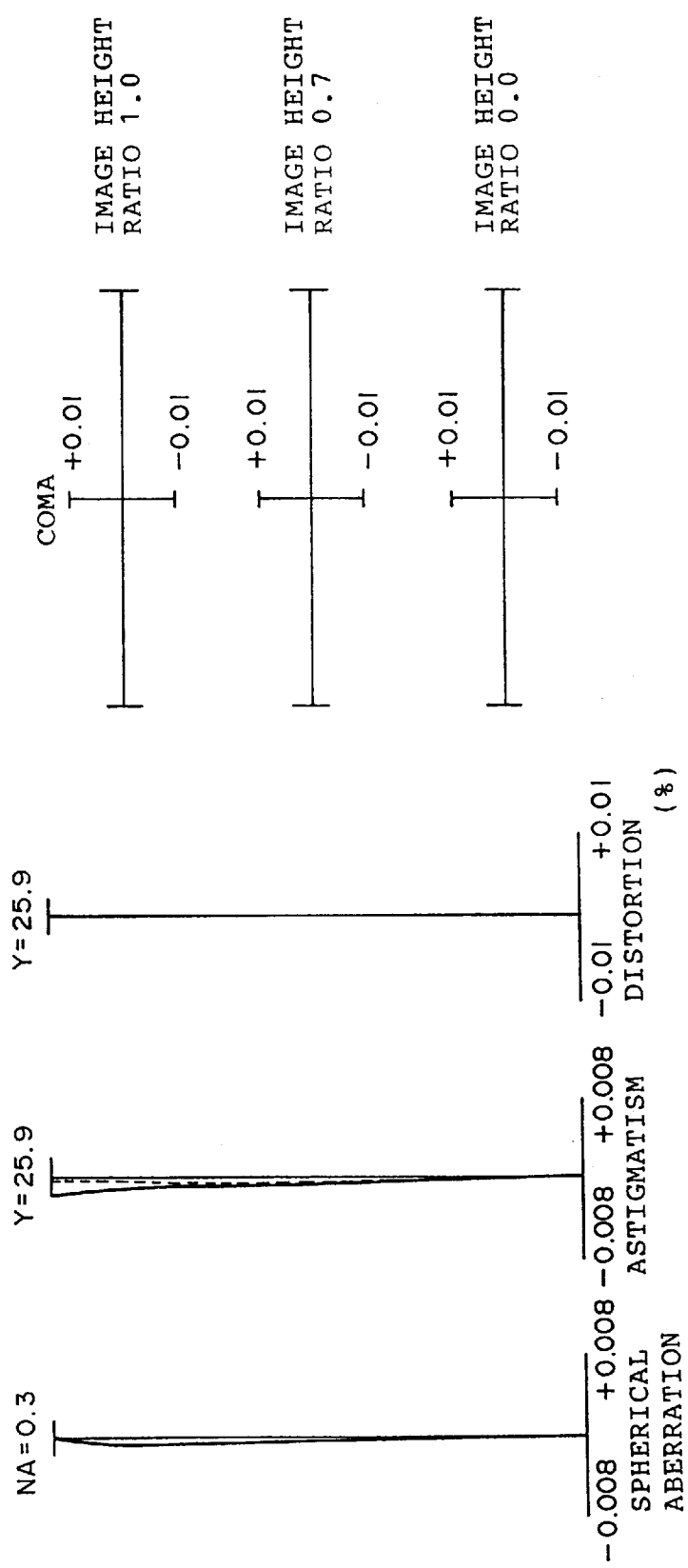
FIG. 10 is aberration diagrams to show aberrations in the projection optical system of the fourth embodiment as shown in FIG. 6.

The lens arrangement of the fourth embodiment shown in FIG. 6 is similar to that of the first embodiment as shown in FIG. 3 and described previously. Here, the first lens group $G_1$ in the fourth embodiment is different from that in the first embodiment in that the first lens group $G_1$ is composed of a positive lens (positive meniscus lens) $L_{11}$ shaped with a convex surface to the image, a negative lens (negative lens of a biconcave shape) $L_{12}$ shaped with a concave surface to the object, a positive lens (positive lens of a biconvex shape) $L_{13}$ shaped with a convex surface to the object, and a positive lens $L_{14}$ of a biconvex shape in order from the object side.

Further, the fourth lens group in the fourth embodiment is different from that in the first embodiment in that the fourth lens group $G_4$ has a negative lens (negative meniscus lens: front lens) $L_{41}$ disposed as closest to the object and shaped with a concave surface to the image, a negative lens (negative meniscus lens: rear lens) $L_{43}$ disposed as closest to the image and shaped with a concave surface to the object, and a negative lens $L_{42}$ of a biconcave shape disposed between these front lens $L_{41}$ and rear lens $L_{43}$.

Also in the present embodiment, the aperture stop AS is disposed between the image-side concave surface of the front lens $L_{41}$ and the object-side concave surface of the rear lens $L_{43}$ in the fourth lens group $G_4$.

Here, the first lens group $G_1$ in the present embodiment is so arranged that the image-side convex surface of the positive meniscus lens $L_{11}$ and the object-side concave surface of the negative biconcave lens $L_{12}$ have nearly equal curvatures and are arranged as relatively close to each other and that the image-side concave surface of the negative biconcave lens $L_{12}$ and the object-side convex surface of the positive biconvex lens $L_{13}$ have nearly equal curvatures and are arranged as relatively close to each other. In the present embodiment, higher-order distortion is corrected in each set of the lens surfaces arranged as close to each other. Since in the present embodiment the first positive lens $L_{53}$ in the fifth lens group $G_5$ is arranged to have a convex surface opposed to the negative biconcave lens $L_{54}$ and the other lens surface on the opposite side to the negative lens $L_{54}$ is also a convex surface, the higher-order spherical aberration can be prevented from appearing with an increase of numerical aperture. The second to fourth lens groups $G_2$–$G_4$ in the fourth embodiment achieve the same functions as in the first embodiment described previously.

Table 1 to Table 8 to follow list values of specifications and correspondent values to the conditions for the respective embodiments in the present invention.

In the tables, left-end numerals represent orders from the object side (reticle R side). For example, the lens surface of No. 1 represents an object-side surface of the lens $L_{11}$, the lens surface of No. 2 represents an image-side surface of the lens $L_{11}$, and further the lens surface of No. 3 represents an object-side surface of the lens $L_{12}$. And, in the tables, r radii of curvatures of lens surfaces, d separations between lens surfaces, n refractive indices of glass materials for exposure wavelength $\lambda$ of 365 nm, $d_0$ the distance along the optical axis from the first object (reticle R) to the lens surface (first lens surface) closest to the object (reticle R) in the first lens group $G_1$, $\beta$ the projection magnification of projection optical system, Bf the distance along the optical axis from the lens surface closest to the image (wafer W) in the fifth lens group $G_5$ to the image plane (wafer W plane), NA the numerical aperture on the image side (wafer W side), of projection optical system, and L the object-to-image distance from the object plane P1 (reticle R plane) to the image plane P2 (wafer W plane). Further, in the tables, $f_1$ represents the focal length of the first lens group $G_1$, and similarly $f_2$ is the focal length of the second lens group $G_2$, $f_3$ is the focal length of the third lens group $G_3$, $f_4$ is the focal length of the fourth lens group $G_4$, $f_5$ is the focal length of the fifth lens group $G_5$, $f_{1-3}$ is the composite focal length of the first lens group $G_1$ to the third lens group $G_3$, $f_{4-5}$ is the composite focal length of the fourth lens group $G_4$ and the fifth lens group $G_5$, I is the axial distance from the first object (reticle) to the first-object-side focal point F of the entire projection optical system (provided that the first-object-side focal point F of the entire projection optical system means an intersecting point of emergent light with the optical axis when parallel light in the paraxial region with respect to the optical axis of the projection optical system is mare incident from the second object side of the projection optical system and the light in the paraxial region is emergent from the projection optical system), $f_n$ is the composite focal length of the second and third lenses ($L_{M2}$, $L_{M3}$) in the intermediate lens group $G_{2M}$ in the second lens group $G_2$, $r_{5p1}$ is the radius of curvature of the lens surface on the image side (wafer W side), of the first positive lens ($L_{53}$) in the fifth lens group $G_5$, $r_{5n1}$ is the radius of curvature of the lens surface on the object side (reticle R side), of the negative biconcave lens ($L_{54}$) in the fifth lens group $G_5$, $r_{5p2}$ is the radius of curvature of the lens surface on the object side (reticle R side), of the second positive lens ($L_{55}$) in the fifth lens group $G_5$, $r_{5n2}$ is the radius of curvature of the lens surface on the image side (wafer W side), of the negative biconcave lens ($L_{54}$) in the fifth lens group $G_5$, $r_{4F}$ is the radius of curvature of the lens surface on the image side (wafer W side), of the front lens ($L_{41}$) in the fourth lens group $G_4$, $r_{4R1}$ is the radius of curvature of the lens surface on the object side (reticle R side), of the rear lens ($L_{43}$) in the fourth lens group $G_4$, $r_{4R2}$ is the radius of curvature of the lens surface on the image side (wafer W side), of the rear lens ($L_{43}$) in the fourth lens group $G_4$, D is the axial distance from the lens surface on the image side (wafer W side), of the third lens ($L_{M3}$) in the intermediate lens group $G_{2M}$ in the second lens group $G_2$ to the lens surface on the object side (reticle R side), of the rear lens ($L_{2R}$) in the second lens group $G_2$, $\Phi_{21}$ is the refracting power of the lens surface on the image side (wafer W side), of the first lens ($L_{M1}$) in the intermediate lens group $G_{2M}$ in the second lens group $G_2$, $f_{2F}$ is the focal length of the front lens ($r_{2F}$) in the second lens group $G_2$, $f_{2R}$ is the focal length of the rear lens ($r_{2R}$) in the second lens group $G_2$, $f_{22}$ is the focal length of the second lens ($L_{M2}$) in the intermediate lens group $G_{2M}$ in the second lens group $G_2$, and $f_{23}$ is the focal length of the third lens ($L_{M3}$) in the intermediate lens group $G_{2M}$ in the second lens group $G_2$.

TABLE 1

First Embodiment d0 = 68.278
β = 1/2.5
NA = 0.3
Bf = 23.366
L = 1000

| | r | d | n |
|---|---|---|---|
| 1 | 412.4222 | 29.607 | 1.53627 |
| 2 | −194.9125 | 5.422 | 1.00000 |
| 3 | −162.8459 | 12.500 | 1.66638 |
| 4 | 267.2084 | 2.921 | 1.00000 |
| 5 | 271.8309 | 34.952 | 1.53627 |
| 6 | −213.4911 | 0.987 | 1.00000 |
| 7 | 266.2656 | 26.766 | 1.53627 |
| 8 | −468.7409 | 4.375 | 1.00000 |
| 9 | 270.4805 | 18.099 | 1.53627 |
| 10 | 135.8598 | 16.655 | 1.00000 |
| 11 | 937.8750 | 16.667 | 1.53627 |
| 12 | −4807.94 | 0.833 | 1.00000 |
| 13 | 234.5026 | 23.371 | 1.53627 |
| 14 | 111.3855 | 24.221 | 1.00000 |
| 15 | −175.0000 | 12.500 | 1.53627 |
| 16 | 267.3503 | 62.757 | 1.00000 |
| 17 | −194.6379 | 16.307 | 1.66638 |
| 18 | −261.8110 | 16.666 | 1.00000 |
| 19 | −169.1972 | 29.165 | 1.53627 |
| 20 | −166.7514 | 0.833 | 1.00000 |
| 21 | −3759.37 | 20.038 | 1.53627 |
| 22 | −345.5933 | 0.833 | 1.00000 |
| 23 | 996.1417 | 26.307 | 1.53627 |
| 24 | −276.4660 | 0.833 | 1.00000 |
| 25 | 191.6667 | 28.348 | 1.53627 |
| 26 | −2773.83 | 0.833 | 1.00000 |
| 27 | 213.3310 | 18.065 | 1.53627 |
| 28 | 570.8902 | 0.833 | 1.00000 |
| 29 | 171.5888 | 18.299 | 1.53627 |
| 30 | 230.1838 | 17.084 | 1.00000 |
| 31 | −1808.22 | 24.761 | 1.53627 |
| 32 | 85.0461 | 14.955 | 1.00000 |
| 33 | −242.2847 | 12.500 | 1.66638 |
| 34 | 227.9011 | 24.251 | 1.00000 |
| 35 | −117.1621 | 12.500 | 1.66638 |
| 36 | −846.9536 | 12.500 | 1.00000 |
| 37 | −264.5842 | 20.833 | 1.53627 |
| 38 | −152.1755 | 13.063 | 1.00000 |
| 39 | −2730.03 | 27.827 | 1.53627 |
| 40 | −200.3783 | 1.246 | 1.00000 |
| 41 | 363.0091 | 23.528 | 1.53627 |
| 42 | −409.7989 | 0.833 | 1.00000 |
| 43 | 191.3014 | 28.174 | 1.53627 |
| 44 | −801.7430 | 7.180 | 1.00000 |
| 45 | −346.4386 | 12.500 | 1.66638 |
| 46 | 218.5468 | 3.510 | 1.00000 |
| 47 | 229.2437 | 19.004 | 1.53627 |
| 48 | 1794.80 | 0.833 | 1.00000 |
| 49 | 203.1685 | 27.146 | 1.53627 |
| 50 | −500.0000 | 83.333 | 1.00000 |
| 51 | 333.2970 | 12.500 | 1.53627 |
| 52 | −1423.25 | 6.960 | 1.00000 |
| 53 | −153.2454 | 12.500 | 1.53627 |
| 54 | 96.2920 | 0.833 | 1.00000 |
| 55 | 66.7883 | 18.011 | 1.53627 |
| 56 | 450.4200 | (Bf) | 1.00000 |

TABLE 2

Correspondent Values to the Conditions for First Embodiment

| (1) | f1/f3 = 1.93 |
| (2) | f2/f4 = 1.94 |
| (3) | f5/L = 0.104 |
| (4) | f1-3/f4-5 = 2.01 |
| (5) | I/L = 2.55 |
| (6) | fn/L = −0.131 |
| (7) | (r5p1 − r5n1)/(r5p1 + r5n1) = 0.397 |
| (8) | (r5p2 − r5n2)/(r5p2 + r5n2) = 0.0239 |
| (9) | f3/f5 = 0.990 |
| (10) | \|(r4F − r4R1)/(r4F + r4R1)\| = 6.93 |
| (11) | D/L = 0.0628 |
| (12) | f4/L = −0.0493 |
| (13) | f2/L = −0.953 |
| (14) | (r4R1 − r4R2)/(r4R1 + r4R2) = −0.757 |
| (15) | 1/(φ21 · L) = 8.97 |
| (16) | f2F/f2R = 0.424 |
| (17) | f22/f23 = 2.17 |

TABLE 3

Second Embodiment d0 = 70.950
β = 1/2.5
NA = 0.3
Bf = 23.416
L = 1000

| | r | d | n |
|---|---|---|---|
| 1 | 438.9848 | 29.298 | 1.61536 |
| 2 | −245.0390 | 8.217 | 1.00000 |
| 3 | −166.0688 | 19.157 | 1.61298 |
| 4 | 376.2596 | 6.534 | 1.00000 |
| 5 | 785.8269 | 24.879 | 1.61536 |
| 6 | −272.5224 | 0.833 | 1.00000 |
| 7 | 275.3049 | 30.833 | 1.61536 |
| 8 | −347.8966 | 0.833 | 1.00000 |
| 9 | 257.3250 | 15.417 | 1.61536 |
| 10 | 123.5907 | 21.196 | 1.00000 |
| 11 | 571.2622 | 25.000 | 1.48734 |
| 12 | −968.7476 | 0.833 | 1.00000 |
| 13 | 154.2173 | 14.583 | 1.61536 |
| 14 | 100.9802 | 27.566 | 1.00000 |
| 15 | −188.6211 | 14.583 | 1.61536 |
| 16 | 265.1972 | 61.127 | 1.00000 |
| 17 | −116.3706 | 15.417 | 1.61298 |
| 18 | −265.4487 | 7.179 | 1.00000 |
| 19 | −179.9332 | 24.447 | 1.48734 |
| 20 | −149.1401 | 0.833 | 1.00000 |
| 21 | −369.4268 | 17.894 | 1.61536 |
| 22 | −192.0942 | 0.833 | 1.00000 |
| 23 | −904.4969 | 19.479 | 1.48734 |
| 24 | −242.2845 | 0.833 | 1.00000 |
| 25 | 226.8559 | 26.591 | 1.61536 |
| 26 | −1048.27 | 0.833 | 1.00000 |
| 27 | 216.9626 | 21.096 | 1.61536 |
| 28 | 766.4880 | 0.833 | 1.00000 |
| 29 | 165.7666 | 20.473 | 1.61536 |
| 30 | 383.2054 | 5.876 | 1.00000 |
| 31 | 956.6166 | 27.675 | 1.61536 |
| 32 | 87.2387 | 18.200 | 1.00000 |
| 33 | −201.4157 | 12.500 | 1.61298 |
| 34 | 213.6915 | 36.474 | 1.00000 |
| 35 | −138.4657 | 12.500 | 1.61298 |
| 36 | −2357.25 | 8.609 | 1.00000 |
| 37 | −241.5240 | 17.723 | 1.61536 |
| 38 | −204.8462 | 1.448 | 1.00000 |
| 39 | −1852.25 | 22.824 | 1.61536 |
| 40 | −174.0053 | 0.833 | 1.00000 |
| 41 | 268.5612 | 28.273 | 1.48734 |
| 42 | −355.5957 | 0.833 | 1.00000 |
| 43 | 332.4732 | 22.101 | 1.61536 |
| 44 | −701.8630 | 9.127 | 1.00000 |
| 45 | −273.7240 | 18.333 | 1.61298 |
| 46 | 155.0581 | 3.328 | 1.00000 |
| 47 | 161.9132 | 29.479 | 1.61536 |

TABLE 3-continued

Second Embodiment

| | | | |
|---|---|---|---|
| 48 | −1617.27 | 0.833 | 1.00000 |
| 49 | 188.0944 | 29.979 | 1.48734 |
| 50 | −532.8834 | 87.293 | 1.00000 |
| 51 | −1061.89 | 17.900 | 1.61536 |
| 52 | −186.0014 | 4.601 | 1.00000 |
| 53 | −126.4247 | 12.500 | 1.61536 |
| 54 | 102.5376 | 0.833 | 1.00000 |
| 55 | 73.4643 | 17.917 | 1.61536 |
| 56 | 1587.70 | (Bf) | 1.00000 |

TABLE 4

Correspondent Values to the Conditions for Second Embodiment

| | |
|---|---|
| (1) | f1/f3 = 2.04 |
| (2) | f2/f4 = 1.40 |
| (3) | f5/L = 0.110 |
| (4) | f1–3/f4–5 = 2.00 |
| (5) | I/L = 2.84 |
| (6) | fn/L = −0.130 |
| (7) | (r5p1 − r5n1)/(r5p1 + r5n1) = 0.439 |
| (8) | (r5p2 − r5n2)/(r5p2 + r5n2) = 0.0216 |
| (9) | f3/f5 = 0.824 |
| (10) | \| (r4F − r4R1)/(r4F + r4R1) \| = 4.41 |
| (11) | D/L = 0.0611 |
| (12) | f4/L = −0.0502 |
| (13) | f2/L = −0.0701 |
| (14) | (r4R1 − r4R2)/(r4R1 + r4R2) = −0.889 |
| (15) | 1/(φ21 · L) = 1.99 |
| (16) | f2F/f2R = 1.15 |
| (17) | f22/f23 = 3.00 |

TABLE 5

Third Embodiment
d0 = 68.124
β = 1/2.5
NA = 0.3
Bf = 23.366
L = 1000

| | r | d | n |
|---|---|---|---|
| 1 | 576.4927 | 26.973 | 1.53627 |
| 2 | −237.2020 | 7.177 | 1.00000 |
| 3 | −170.9914 | 12.500 | 1.66638 |
| 4 | 444.8712 | 7.568 | 1.00000 |
| 5 | 1792.61 | 28.021 | 1.53627 |
| 6 | −212.4851 | 0.417 | 1.00000 |
| 7 | 314.5147 | 32.434 | 1.53627 |
| 8 | −315.7722 | 0.417 | 1.00000 |
| 9 | 233.5823 | 16.667 | 1.53627 |
| 10 | 190.6719 | 9.323 | 1.00000 |
| 11 | 398.7885 | 19.814 | 1.53627 |
| 12 | −850.0000 | 0.417 | 1.00000 |
| 13 | 157.1780 | 15.523 | 1.53627 |
| 14 | 91.0735 | 24.101 | 1.00000 |
| 15 | −462.5909 | 12.500 | 1.53627 |
| 16 | 149.0328 | 53.333 | 1.00000 |
| 17 | −109.6238 | 16.864 | 1.66638 |
| 18 | −816.8008 | 31.244 | 1.00000 |
| 19 | −209.8917 | 39.167 | 1.53627 |
| 20 | −170.3243 | 7.090 | 1.00000 |
| 21 | −872.0596 | 29.168 | 1.53627 |
| 22 | −196.3948 | 0.417 | 1.00000 |
| 23 | 653.4305 | 33.251 | 1.53627 |
| 24 | −297.0283 | 0.417 | 1.00000 |
| 25 | 180.9216 | 29.535 | 1.53627 |
| 26 | 954.6750 | 0.417 | 1.00000 |
| 27 | 173.7978 | 20.187 | 1.53627 |
| 28 | 318.5177 | 0.894 | 1.00000 |

TABLE 5-continued

Third Embodiment
d0 = 68.124
β = 1/2.5
NA = 0.3
Bf = 23.366
L = 1000

| | r | d | n |
|---|---|---|---|
| 29 | 170.1111 | 21.193 | 1.53627 |
| 30 | 238.3822 | 12.372 | 1.00000 |
| 31 | 685.7469 | 24.414 | 1.53627 |
| 32 | 79.6257 | 16.619 | 1.00000 |
| 33 | −253.6105 | 12.500 | 1.66638 |
| 34 | 147.9984 | 34.820 | 1.00000 |
| 35 | −202.3445 | 12.925 | 1.66638 |
| 36 | −435.0316 | 29.554 | 1.00000 |
| 37 | −248.2723 | 18.070 | 1.53627 |
| 38 | −209.1025 | 1.743 | 1.00000 |
| 39 | 631.5679 | 22.445 | 1.53627 |
| 40 | −270.4465 | 0.417 | 1.00000 |
| 41 | 195.1878 | 27.668 | 1.53627 |
| 42 | −704.7159 | 0.417 | 1.00000 |
| 43 | 173.6696 | 29.574 | 1.53627 |
| 44 | −487.8900 | 5.254 | 1.00000 |
| 45 | −356.1380 | 12.500 | 1.66638 |
| 46 | 128.7500 | 5.466 | 1.00000 |
| 47 | 150.0000 | 21.894 | 1.53627 |
| 48 | 1460.88 | 0.417 | 1.00000 |
| 49 | 216.4808 | 26.263 | 1.53527 |
| 50 | −849.2433 | 19.707 | 1.00000 |
| 51 | −323.6034 | 26.786 | 1.53627 |
| 52 | −192.9683 | 16.980 | 1.00000 |
| 53 | −139.3306 | 12.500 | 1.53627 |
| 54 | 124.1610 | 1.434 | 1.00000 |
| 55 | 72.8408 | 18.816 | 1.53627 |
| 56 | 752.1024 | (Bf) | 1.00000 |

TABLE 6

Correspondent Values to the Conditions for Third Embodiment

| | |
|---|---|
| (1) | f1/f3 = 2.48 |
| (2) | f2/f4 = 1.45 |
| (3) | f5/L = 0.112 |
| (4) | f1–3/f4–5 = 1.97 |
| (5) | I/L = 2.42 |
| (6) | fn/L = −0.138 |
| (7) | (r5p1 − r5n1)/(r5p1 + r5n1) = 0.156 |
| (8) | (r5p2 − r5n2)/(r5p2 + r5n2) = 0.0762 |
| (9) | f3/f5 = 0.859 |
| (10) | \|(r4F − r4R1)/(r4F + r4R1)\| = 2.30 |
| (11) | D/L = 0.0533 |
| (12) | f4/L = −0.0604 |
| (13) | f2/L = −0.0873 |
| (14) | (r4R1 − r4R2)/(r4R1 + r4R2) = −0.365 |
| (15) | 1/(φ21 · L) = 1.59 |
| (16) | f2F/f2R = 11.7 |
| (17) | f22/f23 = 2.11 |

TABLE 7

Fourth Embodiment
d0 = 66.958
β = 1/2.5
NA = 0.3
Bf = 24.679
L = 1000

| | r | d | n |
|---|---|---|---|
| 1 | −590.3602 | 17.187 | 1.61536 |
| 2 | −247.2986 | 11.149 | 1.00000 |

TABLE 7-continued

Fourth Embodiment
d0 = 66.958
β = 1/2.5
NA = 0.3
Bf = 24.679
L = 1000

|    | r          | d       | n        |
|----|------------|---------|----------|
| 3  | −141.4186  | 12.500  | 1.61298  |
| 4  | 592.7528   | 8.779   | 1.00000  |
| 5  | 1693.50    | 35.323  | 1.61536  |
| 6  | −181.2212  | 1.297   | −1.00000 |
| 7  | 359.6900   | 31.975  | 1.61536  |
| 8  | −436.8156  | 0.417   | 1.00000  |
| 9  | 272.6790   | 16.667  | 1.61536  |
| 10 | 203.2115   | 5.189   | 1.00000  |
| 11 | 249.7060   | 27.859  | 1.48734  |
| 12 | −833.3333  | 0.417   | 1.00000  |
| 13 | 150.8961   | 26.445  | 1.61536  |
| 14 | 92.9760    | 25.814  | 1.00000  |
| 15 | −494.8144  | 12.500  | 1.61536  |
| 16 | 154.4961   | 52.083  | 1.00000  |
| 17 | −109.5902  | 18.030  | 1.61298  |
| 18 | −4166.67   | 18.750  | 1.00000  |
| 19 | −558.4031  | 33.333  | 1.48734  |
| 20 | −153.2906  | 16.830  | 1.00000  |
| 21 | −510.6857  | 19.362  | 1.61536  |
| 22 | −249.6976  | 0.417   | 1.00000  |
| 23 | 2759.07    | 33.333  | 1.48734  |
| 24 | −204.7557  | 0.417   | 1.00000  |
| 25 | 198.3871   | 25.098  | 1.61536  |
| 26 | 765.2665   | 0.417   | 1.00000  |
| 27 | 186.3753   | 19.881  | 1.61536  |
| 28 | 369.6797   | 1.171   | 1.00000  |
| 29 | 172.2863   | 20.796  | 1.61536  |
| 30 | 239.5223   | 12.690  | 1.00000  |
| 31 | 470.2886   | 23.902  | 1.61536  |
| 32 | 82.5312    | 16.699  | 1.00000  |
| 33 | −210.5282  | 29.277  | 1.61298  |
| 34 | 173.4522   | 25.554  | 1.00000  |
| 35 | −161.8557  | 12.500  | 1.61298  |
| 36 | −966.7899  | 27.185  | 1.00000  |
| 37 | −564.2941  | 16.575  | 1.61536  |
| 38 | −188.0721  | 0.417   | 1.00000  |
| 39 | 542.4653   | 13.931  | 1.61536  |
| 40 | −18771.98  | 0.417   | 1.00000  |
| 41 | 227.1766   | 29.254  | 1.48734  |
| 42 | −237.4964  | 0.417   | 1.00000  |
| 43 | 217.3657   | 22.437  | 1.61536  |
| 44 | −992.8784  | 7.486   | 1.00000  |
| 45 | −257.7989  | 12.500  | 1.61298  |
| 46 | 117.9183   | 1.851   | 1.00000  |
| 47 | 120.6975   | 25.724  | 1.61535  |
| 48 | 1294.79    | 0.417   | 1.00000  |
| 49 | 193.0318   | 32.321  | 1.48734  |
| 50 | −587.1447  | 28.790  | 1.00000  |
| 51 | −811.6837  | 20.343  | 1.61536  |
| 52 | −240.9737  | 22.422  | 1.00000  |
| 53 | −125.4616  | 12.500  | 1.61536  |
| 54 | 152.5752   | 0.417   | 1.00000  |
| 55 | 76.9324    | 18.904  | 1.61536  |
| 56 | 2095.86    | (Bf)    | 1.00000  |

TABLE 8

Correspondent Values to the Conditions for
Fourth Embodiment

| (1)  | f1/f3 = 2.75                           |
| (2)  | f2/f4 = 1.73                           |
| (3)  | f5/L = 0.107                           |
| (4)  | f1–3/f4–5 = 2.36                       |
| (5)  | I/L = 2.41                             |
| (6)  | fn/L = −0.135                          |
| (7)  | (r5p1 − r5n1)/(r5p1 + r5n1) = 0.587    |
| (8)  | (r5p2 − r5n2)/(r5p2 + r5n2) = 0.0116   |
| (9)  | f3/f5 = 0.900                          |
| (10) | \|(r4F − r4R1)/(r4F − r4R1) = 3.08     |
| (11) | D/L = 0.0521                           |
| (12) | f4/L = −0.0541                         |
| (13) | f2/L = −0.0939                         |
| (14) | (r4R1 − r4R2)/(r4R + r4R2) = −0.713    |
| (15) | 1/(ø21 · L) = 1.71                     |
| (16) | f2F/f2R = 7.76                         |
| (17) | f22/f23 = 2.51                         |

It is understood from the above values of specifications for the respective embodiments that the projection optical systems according to the embodiments achieved satisfactory telecentricity on the object side (reticle R side) and on the image side (wafer W side) as securing the wide exposure areas and relatively large numerical apertures.

FIG. 7 to FIG. 10 are aberration diagrams to show aberrations in the first to fourth embodiments.

Here, in each aberration diagram, NA represents the numerical aperture of the projection optical system, and Y the image height, and in each astigmatism diagram, the dashed line represents the meridional image surface and the solid line the sagittal image surface.

It is understood from comparison of the aberration diagrams that the aberrations are corrected in a good balance in each embodiment even with a wide exposure area (image height) and a relatively large numerical aperture, particularly, distortion is extremely well corrected up to nearly zero throughout the entire image, thus achieving the projection optical system with high resolving power in a very wide exposure area.

The above-described embodiments showed the examples using the mercury lamp as a light source for supplying the exposure light of the i-line (365 nm), but it is needless to mention that the invention is not limited to the examples; for example, the invention may employ light sources including a mercury lamp supplying the exposure light of the g-line (435 nm), and extreme ultraviolet light sources such as excimer lasers supplying light of 193 nm or 248 nm.

In the above each embodiment the lenses constituting the projection optical system are not cemented to each other, which can avoid a problem of a change of cemented surfaces with rime. Although in the above each embodiment the lenses constituting the projection optical system are made of a plurality of optic materials, they may be made of a single glass material, for example quartz ($SiO_2$) if the wavelength region of the light source is not a wide band.

As described above, the present invention can realize high-performance projection optical systems having relatively large numerical apertures and achieving the bitelecentricity and superior correction of aberrations in a very wide exposure area.

Particularly, the present invention can achieve high-performance projection optical systems well corrected for distortion throughout a very wide exposure area.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 055979/1995 filed on Mar. 15, 1995 is hereby incorporated by reference.

What is claimed is:

1. A projection optical system located between a first and second objects, for projecting an image of the first object onto the second object, said projection optical system comprising a first lens group with a positive refracting power, a second lens group with a negative refracting power, a third lens group with a positive refracting power, a fourth lens group with a negative refracting power, and a fifth lens group with a positive refracting power in order from the side of said first object, wherein when $f_1$ is a focal length of said first lens group, $f_2$ is a focal length of said second lens group, $f_3$ is a focal length of said third lens group, $f_4$ is a focal length of said fourth lens group, $f_5$ is a focal length of said fifth lens group, $f_{1-3}$ is a composite focal length of said first lens group to third lens group, $f_{4-5}$ is a composite focal length of said fourth lens group and said fifth lens group, and L is a distance from said first object to said second object, the following conditions are satisfied:

$0.1 < f_1/f_3 < 17$ $0.1 < f_5/f_4 < 14$ $0.01 < f_5/L < 0.8$ $f_{1-3}/f_{4-5} < 2.5$ and wherein said first lens group comprises at least two positive lenses, said second lens group comprises at least two negative lenses, said third lens group comprises at least three positive lenses, said fourth lens group comprises at least three negative lenses, and said fifth lens group comprises at least five positive lenses and at least one negative lens.

2. A projection optical system according to claim 1, wherein a magnification of said projection optical system is 1/2.5.

3. A projection optical system according to claim 1, wherein when I is an axial distance from said first object to the first-object-side focal point of said entire projection optical system and L is the distance from said first object to said second object, the following condition is satisfied:

$1.0 < I/L$.

4. A projection optical system according to claim 1, wherein said second lens group comprises a front lens with a negative refracting power disposed as closest to the first object and shaped with a concave surface to the second object, a rear lens of a meniscus shape with a negative refracting power disposed as closest to the second object and shaped with a concave surface to said first object, and an intermediate lens group disposed between the front lens in said second lens group and the rear lens in said second lens group, wherein said intermediate lens group comprises at least a first lens with a positive refracting power, a second lens with a negative refracting power, and a third lens with a negative refracting power in order from the side of said first object, and wherein when $f_n$ is a composite focal length of from said second lens to said third lens in said second lens group and L is the distance from said first object to said second object, the following condition is satisfied:

$-1.4 < f_n/L < -0.123$.

5. A projection optical system according to claim 1, wherein said fifth lens group comprises a negative lens of a biconcave shape, a first positive lens disposed as adjacent to said negative lens of the biconcave shape on the first object side and shaped with a convex surface to the second object, and a second positive lens disposed as adjacent to said negative lens of the biconcave shape on the second object side and shaped with a convex surface to the first object.

6. A projection optical system according to claim 5, wherein when $r_{5p1}$ is a radius of curvature of said convex surface of said first positive lens in said fifth lens group and $r_{5n1}$ is a radius of curvature of a concave surface on the first object side, of said negative lens of the biconcave shape in said fifth lens group, the following condition is satisfied:

$0 < (r_{5p1} - r_{5n1})/(r_{5p1} + r_{5n1}) < 1$.

7. A projection optical system according to claim 5, wherein when $r_{5n2}$ is a radius of curvature of a concave surface on the second object side, of said negative lens of the biconcave shape in said fifth lens group and $r_{5p2}$ is a radius of curvature of said convex surface of the second positive lens in said fifth lens group, the following condition is satisfied:

$0 < (r_{5p2} - r_{5n2})/(r_{5p2} + r_{5n2}) < 1$.

8. A projection optical system according to claim 5, wherein said negative lens or the biconcave shape, said first positive lens, and said second positive lens are disposed between at least one positive lens in said fifth lens group and at least one positive lens in said fifth lens group.

9. A projection optical system according to claim 1, wherein when $f_3$ is the focal length of said third lens group and $f_5$ is the focal length of said fifth lens group, the following condition is satisfied:

$0.80 < f_3/f_5 < 1.00$.

10. A projection optical system according to claim 1, wherein said fourth lens group comprises a front lens with a negative refracting power disposed as closest to the first object and shaped with a concave surface to the second object, a rear lens with a negative refracting power disposed closest to the second object and shaped with a concave surface to the first object, and at least one negative lens disposed between the front lens in said fourth lens group and the rear lens in said fourth lens group, and wherein when $r_{4F}$ is a radius of curvature of a surface on the second object side, of the front lens disposed as closest to the first object in said fourth lens group and $r_{4R1}$ is a radius of curvature of a surface on the first object side of the rear lens disposed as closest to the second object in said fourth lens group, the following condition is satisfied:

$1.03 < |(r_{4F} - r_{4R1})/(r_{4F} + r_{4R1})|$.

11. A projection optical system according to claim 4, wherein when D is an axial distance from a second-object-side lens surface of the third lens with the negative refracting power in the intermediate lens group in said second lens group to a first-object-side lens surface of the rear lens in the second lens group and L is the distance from said first object to said second object, the following condition is satisfied:

$0.05 < D/L < 0.4$.

12. A projection optical system according to claim 1, wherein when $f_4$ is the focal length of said fourth lens group and L is the distance from said first object to said second object, the following condition is satisfied:

$$-0.098 < f_4/L < -0.005.$$

13. A projection optical system according to claim 1, wherein when $f_2$ is the focal length of said second lens group and L is the distance from said first object to said second object, the following condition is satisfied:

$$-0.8 < f_2/L < -0.050.$$

14. A projection optical system according to claim 1, wherein said fourth lens group comprises a front lens with a negative refracting power disposed as closest to the first object and shaped with a concave surface to the second object, a rear lens with a negative refracting power disposed as closest to the second object and shaped with a concave surface to the first object, and at least one negative lens disposed between said front lens in said fourth lens group and said rear lens in said fourth lens group, and wherein when $r_{4R1}$ is a radius of curvature of a first-object-side surface of the rear lens disposed as closest to the second object in said fourth lens group and $r_{4R2}$ is a radius of curvature of a second-object-side surface of said rear lens, the following condition is satisfied:

$$-1.00 \leq (r_{4R1} - r_{4R2})/(r_{4R1} + r_{4R2}) < 0.$$

15. A projection optical system according to claim 4, wherein the first lens with the positive refracting power in the intermediate lens group in said second lens group has a lens shape with a convex surface to the second object, and
wherein when $\Phi_{21}$ is a refracting power of the second-object-side lens surface or the first lens with the positive refracting power in the intermediate lens group in said second lens group and L is the distance from said first object to said second object, the following condition is satisfied:

$$0.54 < 1/(\Phi_{21} \cdot L) < 10.$$

16. A projection optical system according to claim 4, wherein when $f_{2F}$ is a focal length of the front lens with the negative refracting power disposed as closest to the first object in the second lens group and shaped with the concave surface to said second object and $f_{2R}$ is a focal length of the rear lens with the negative refracting power disposed as closest to the second object in said second lens group and shaped with the concave surface to said first object, the following condition is satisfied:

$$0 \leq f_{2F}/f_{2R} < 18.$$

17. A projection optical system according to claim 4, wherein the intermediate lens group in said second lens group has a negative refracting power.

18. A projection optical system according to claim 4, wherein among the lenses in said intermediate lens group only said second lens and said third lens have respective, negative refracting powers and wherein when $f_{22}$ is a focal length of the second lens with the negative refracting power in said second lens group and $f_{23}$ is a focal length of the third lens with the negative refracting power in said second lens group, the following condition is satisfied:

$$0.7 < f_{22}/f_{23}.$$

19. An exposure method, comprising the steps of:
emitting ultraviolet light to a mask that a predetermined pattern is formed on; and
forming a reduced image of said predetermined pattern on a photosensitive substrate through a projection optical system according to claim 1,
wherein said projection optical system is provided between said mask and said photosensitive substrate.

20. An exposure apparatus comprising:
a first stage allowing a photosensitive substrate to be held on a main surface thereof;
an illumination optical system for emitting exposure light of a predetermined wavelength and transferring a predetermined pattern on a mask onto the substrate; and
a projection optical system provided between said first stage and said illumination, for projecting an image on the mask, on the substrate surface, said projection optical system having a first lens group with a positive refracting power, a second lens group with a negative refracting power, a third lens group with a positive refracting power, a fourth lens group with a negative refracting power, and a fifth lens group with a positive refracting power in order from the side of said first object,
wherein when $f_1$ is a focal length of said first lens group, $f_2$ is a focal length of said second lens group, $f_3$ is a focal point of said third lens group, $f_4$ is a focal point of said fourth lens group, $f_5$ is a focal length of said fifth lens group, $f_{1-3}$ is a composite focal length of said first lens group to third lens group, $f_{4-5}$ is a composite focal length of said fourth lens group and said fifth lens group, and L is a distance from said first object to said second object, the following conditions are satisfied:

$$0.1 < f_1/f_3 < 17$$

$$0.1 < f_2/f_4 < 14$$

$$0.01 < f_5/L < 0.8$$

$$f_{1-3}/f_{4-5} < 2.5,$$

and
wherein said first lens group comprises at least two positive lenses, said second lens group comprises at least two negative lenses, said third lens group comprises at least three positive lenses, said fourth lens group comprises at least three negative lenses, and said fifth lens group comprises at least five positive lenses and at least one negative lens.

21. An exposure apparatus according to claim 20, wherein a magnification of said projection optical system is 1/2.5.

22. An exposure apparatus according to claim 20, further comprising a second stage for supporting the mask, and
wherein said projection optical system is positioned between said first stage and said second stage.

23. A projection optical system provided between a first object and a second object and projecting an image of said first object onto said second object, said projection optical system comprising:
a first lens group with a positive refracting power which has at least two positive lenses;
a second lens group with a negative refracting power which is provided between said first lens group and said second object, and which has at least two negative lenses;
a third lens group with a positive refracting power which is provided between said second lens group and said second object, and which has at least three positive lenses;

a fourth lens group with a negative refracting power which is provided between said third lens group and said second object, and which has at least three negative lenses; and a fifth lens group with a positive refracting power which is provided between said fourth lens group and said second object, and which has at least three positive lenses, a biconcave lens, a first positive lens arranged adjacent to a first-object side of said biconcave lens and shaped with a convex surface to said second object, and a second positive lens arranged adjacent to a second-object side of said biconcave lens and shaped with a convex surface to said first object.

24. A projection optical system according to claim 23, wherein when I is an axial distance from said first object to the first-object-side focal point of said entire projection optical system and L is the distance from said first object to said second object, the following condition is satisfied:

$1.0<I/L.$

25. A projection optical system according to claim 23, wherein said second lens group comprises a front lens with a negative refracting power disposed as closest to the first object and shaped with a concave surface to the second object, a rear lens of the meniscus shaped with a negative refracting power disposed as closest to the second object and shaped with a concave surface to said first object, and an intermediate lens group disposed between the front lens in said second lens group and the rear lens in said second lens group, wherein said intermediate lens group comprises at least a first lens with a positive refracting power, a second lens with a negative refracting power, and a third lens with a negative refracting power in order from the side of said first object, and wherein when $f_n$ is a composite focal length of from said second lens to said third lens in said second lens group and L is the distance from said first object to said second object, the following condition is satisfied:

$-1.4<I_n/L<-0.123.$

26. A projection optical system according to claim 23, wherein when $r_{sp1}$ is a radius of curvature of said convex surface of said first positive lens in said fifth lens group and $r_{5n1}$ is a radius of curvature of a concave surface on the first object side, of said negative lens of the biconcave shape in said fifth lens group, the following condition is satisfied:

$0<(r_{5p1}-r_{5n1})/(r_{5p1}+r_{5n1})<1.$

27. A projection optical system according to claim 23, wherein when $r_{5n2}$ is a radius of curvature of a concave surface on the second object side, of said negative lens of the biconcave shape in said fifth lens group and $r_{5p2}$ is a radius of curvature of said convex surface of the second positive lens in said fifth lens group, the following condition is satisfied:

$0<(r_{5p2}-r_{5n2})/(r_{5p2}+r_{5n2})<1.$

28. A projection optical system according to claim 23, wherein said negative lens of the biconcave shape, said first positive lens, and said second positive lens are disposed between at least one positive lens in said fifth lens group and at least one positive lens in said fifth lens group.

29. A projection optical system according to claim 23, wherein $f_3$ is the focal length of said third lens group and $f_5$ is the focal length of said fifth lens group, the following condition is satisfied:

$0.80<f_3/f_5<1.00.$

30. A projection optical system according to claim 23, wherein said fourth lens group comprises a front lens with a negative refracting power disposed as closest to the first object and shaped with a concave surface to the second object, a rear lens with a negative refracting power disposed closes to the second object and shaped with a concave surface to the first object; and at least one negative lens disposed between the front lens in said fourth lens group and the rear lens in said fourth lens group, and wherein when $r_{4F}$ is a radius of curvature of a surface on the second object side, of the front lens disposed as closest to the first object in said fourth lens group and $r_{4R1}$ is a radius of curvature of a surface on the first object side of the rear lens disposed as closest to the second object in said fourth lens group, the following condition is satisfied:

$1.03<|(r_{4F}-r_{4R1})/(r_{4F}+r_{4R1})|.$

31. A projection optical system according to claim 23, wherein $f_4$ is the focal length of said fourth lens group and L is the distance from said first object to said second object, the following condition is satisfied:

$-0/098<f_4/L<-0.005.$

32. A projection optical system according to claim 23, wherein when $f_2$ is the focal length of said second lens group and L is the distance from said first object to said second object, the following condition is satisfied:

$-0.8<f_2/L<-0/050.$

33. A projection optical system according to claim 23, wherein said fourth lens group comprises a front lens with a negative refracting power disposed as closest to the first object and shaped with a concave surface to the second object, a rear lens with a negative refracting power disposed as closest to the second object and shaped with a concave surface to the first object, and at least one negative lens disposed between said front lens in said fourth lens group and said rear lens in said fourth lens group, and wherein when $r_{4R1}$ is a radius of curvature of a first-object-side surface of the rear lens disposed as closest to the second object in said fourth lens group and $r_{4R2}$ is a radius of curvature of a second-object-side surface of said rear lens, the following condition is satisfied:

$-1.00 \leq (r_{4R1}-r_{4R2})/(r_{4R1}+r_{4R2})<0.$

34. An exposure method, comprising the steps of:
emitting ultraviolet light to a mask that a predetermined pattern is formed on; and
forming a reduced image of said predetermined pattern on a photosensitive substrate through a projection optical system according to claim 23,
wherein said projection optical system is provided between said mask and said photosensitive substrate.

35. An exposure apparatus transferring a predetermined pattern on a mask onto a photosensitive substrate, said exposure apparatus comprising:
an illumination optical system providing exposure light of a predetermined wavelength onto said predetermined pattern on said mask; and
a projection optical system provided between said mask and said photosensitive substrate, and projecting an image of said predetermined pattern on said mask onto said photosensitive substrate, wherein said projection optical system includes:

a first lens group with a positive refracting power which has at least two positive lenses;

a second lens group with a negative refracting power which is provided between said first lens group and said photosensitive substrate, and which has at least two negative lenses;

a third lens group with a positive refracting power which is provided between said second lens group and said photosensitive substrate, and which has at least three positive lenses;

a fourth lens group with a negative refracting power which is provided said third lens group and said photosensitive substrate, and which has at least three negative lenses; and a fifth lens group with a positive refracting power which is provided between said fourth lens group and said photosensitive substrate, and which has at least three positive lenses, a biconcave lens, a first positive lens arranged adjacent to a mask side of said biconcave lens and shaped with a convex surface to said mask.

* * * * *